(12) United States Patent
Oku et al.

(10) Patent No.: US 10,546,797 B2
(45) Date of Patent: Jan. 28, 2020

(54) HEAT TRANSFER STRUCTURE AND MANUFACTURING METHOD THEREFORE

(71) Applicant: Kaneka Corporation, Osaka (JP)

(72) Inventors: Satoshi Oku, Osaka (JP); Makoto Kutsumizu, Osaka (JP); Yasushi Nishikawa, Osaka (JP)

(73) Assignee: KANEKA CORPORATION, Osaka (JP)

( * ) Notice: Subject to any disclaimer, the term of this patent is extended or adjusted under 35 U.S.C. 154(b) by 44 days.

(21) Appl. No.: 15/738,196

(22) PCT Filed: Jun. 23, 2016

(86) PCT No.: PCT/JP2016/068723
§ 371 (c)(1),
(2) Date: Dec. 20, 2017

(87) PCT Pub. No.: WO2016/208690
PCT Pub. Date: Dec. 29, 2016

(65) Prior Publication Data
US 2018/0174944 A1 Jun. 21, 2018

(30) Foreign Application Priority Data

Jun. 26, 2015 (JP) .................................. 2015-129287

(51) Int. Cl.
*H01L 23/373* (2006.01)
*H01L 23/367* (2006.01)
(Continued)

(52) U.S. Cl.
CPC ............ *H01L 23/373* (2013.01); *C01B 32/20* (2017.08); *F28F 3/00* (2013.01); *H01L 21/4878* (2013.01);
(Continued)

(58) Field of Classification Search
CPC ....... H01L 23/367–3738; H01L 23/373; H01L 33/642; H01L 33/64–648; H01L 21/4878;
(Continued)

(56) References Cited

U.S. PATENT DOCUMENTS

| | | | | |
|---|---|---|---|---|
| 5,617,294 A | * | 4/1997 | Watson | ............... H01L 21/4882 174/16.3 |
| 5,660,917 A | * | 8/1997 | Fujimori | ............. H01L 23/3677 428/195.1 |

(Continued)

FOREIGN PATENT DOCUMENTS

| | | |
|---|---|---|
| EP | 1783833 A2 | 5/2007 |
| JP | 2005-317988 A | 11/2005 |

(Continued)

OTHER PUBLICATIONS

Extended European Search Report issued in European Application No. 16814459.0, dated Dec. 17, 2018 (13 pages).

(Continued)

*Primary Examiner* — Zandra V Smith
*Assistant Examiner* — Jeremy J Joy
(74) *Attorney, Agent, or Firm* — Osha Liang LLP

(57) ABSTRACT

Provided are (i) a heat transport structure which is excellent in heat transfer efficiency and (ii) a method of producing such a heat transport structure. The heat transport structure in accordance with an embodiment of the present invention includes: a first thermally conductive material in which through holes are formed; and second thermally conductive materials which are fitted in the respective through holes in a perpendicular direction which is a direction perpendicular to a surface direction, a thermal conductivity which the first thermally conductive material exhibits in the surface direction being higher than a thermal conductivity which the first thermally conductive material exhibits in the perpendicular (Continued)

direction, each of the second thermally conductive materials being held by an inner surface of a corresponding one of the through holes and having fitting strength of not less than 0.5 N/mm per unit circumference of the corresponding one of the through holes.

22 Claims, 3 Drawing Sheets

(51) Int. Cl.

| | | |
|---|---|---|
| *H01L 23/36* | (2006.01) | |
| *H01L 21/48* | (2006.01) | |
| *H05K 7/20* | (2006.01) | |
| *F28F 3/00* | (2006.01) | |
| *C01B 32/20* | (2017.01) | |

(52) U.S. Cl.
CPC .......... *H01L 21/4882* (2013.01); *H01L 23/36* (2013.01); *H01L 23/3677* (2013.01); *H05K 7/20* (2013.01); *Y02P 20/124* (2015.11)

(58) Field of Classification Search
CPC .......... H01L 21/4882; C01B 32/20–21; F28F 3/00–005; F28F 21/02; H05K 7/20
See application file for complete search history.

(56) References Cited

U.S. PATENT DOCUMENTS

| | | | | |
|---|---|---|---|---|
| 6,922,339 | B2* | 7/2005 | Nakamura | .......... H01L 23/3677 165/185 |
| 7,889,502 | B1 | 2/2011 | Reis et al. | |
| 2003/0116312 | A1* | 6/2003 | Krassowski | ............ F28F 13/00 165/185 |
| 2003/0192163 | A1* | 10/2003 | Lipari | .................... B21K 25/00 29/505 |
| 2005/0180111 | A1* | 8/2005 | Bamesberger | ...... H01L 23/3677 361/704 |
| 2007/0102142 | A1* | 5/2007 | Reis | .................... H01L 23/3677 165/80.3 |
| 2007/0103875 | A1 | 5/2007 | Reis et al. | |
| 2007/0139895 | A1* | 6/2007 | Reis | ...................... H01L 33/642 361/719 |
| 2008/0218977 | A1 | 9/2008 | Reis et al. | |
| 2011/0056671 | A1* | 3/2011 | Moon | .................... F28D 15/00 165/185 |
| 2013/0209732 | A1* | 8/2013 | Nishikawa | ......... H05K 7/20509 428/138 |

FOREIGN PATENT DOCUMENTS

| | | | |
|---|---|---|---|
| JP | 3122382 | U | 6/2006 |
| JP | 2007-129201 | A | 5/2007 |
| JP | 2010-263003 | A | 11/2010 |
| JP | 2010263003 | A * | 11/2010 |
| JP | 2011-129634 | A | 6/2011 |

OTHER PUBLICATIONS

International Search Report issued in International Application No. PCT/JP2016/068723, dated Sep. 27, 2016 (2 pages).

International Preliminary Report on Patentability issued in International Application No. PCT/JP2016/068723, dated Jan. 4, 2018 (8 pages).

* cited by examiner

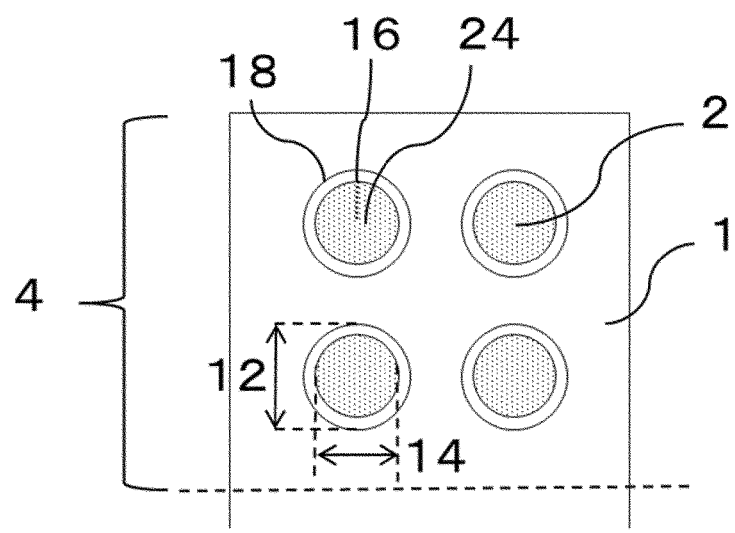
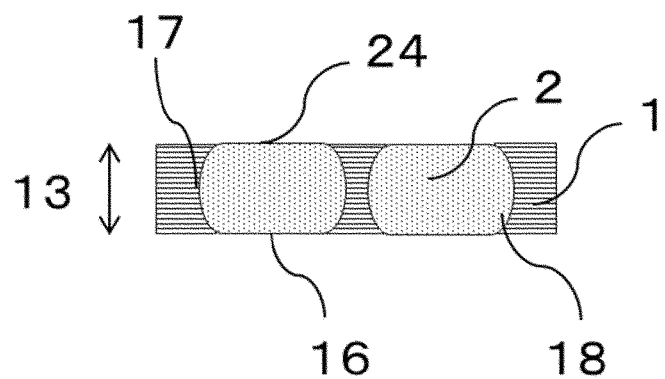

HEAT TRANSFER STRUCTURE AND MANUFACTURING METHOD THEREFORE

TECHNICAL FIELD

The present invention relates to a heat transport structure and a method of producing a heat transport structure.

BACKGROUND ART

In recent years, there has been a demand for a thermally conductive material which allows heat, generated by a heat source provided in an electronic device, to be transferred to a cooling source. As such a thermally conductive material, metal foil or a heat pipe has been conventionally used. However, with the densification, the reduction in weight, or the like of the electronic device, it is sometimes difficult to use the thermally conductive material which mainly employs a metal member.

As a thermally conductive material for solving such a problem, Patent Literature 1 discloses, for example, a thermally conductive material obtained by press-fitting a thermal via, made of an isotropic material, into a hole formed in a graphite planar element so that the thermal via is tightly fitted in the hole. As a thermally conductive structure for solving such a problem, Patent Literature 2 discloses a thermally conductive structure of a printed board in which structure conductor layers provided on respective both surfaces of an insulating substrate are connected to each other via a thermally conductive member.

CITATION LIST

Patent Literature

[Patent Literature 1]
Japanese Patent Application Publication Tokukai No. 2007-129201 (Publication date: May 24, 2007)
[Patent Literature 2]
Japanese Patent Application Publication Tokukai No. 2010-263003 (Publication date: Nov. 18, 2010)

SUMMARY OF INVENTION

Technical Problem

According to the above described conventional method, there can be a problem in transfer of heat from the thermal via to the graphite planar element. This may cause heat transfer efficiency to be poor.

An object of the present invention is to provide (i) a heat transport structure which is so excellent in heat transfer efficiency that heat can be smoothly transferred between a first thermally conductive material and second thermally conductive materials and (ii) a method of producing such a heat transport structure.

Solution to Problem

In order to provide a heat transport structure excellent in heat transfer efficiency in view of the above problem, the inventors of the present invention found it effective to cause each of second thermally conductive materials to be held, with high fitting strength, by an inner surface of a corresponding one of through holes formed in a first thermally conductive material. As a result, the inventors of the present invention completed the present invention. That is, the present invention includes the following.

[1] A heat transport structure including: a first thermally conductive material in which through holes are formed; and second thermally conductive materials which are fitted in the respective through holes, a thermal conductivity which the first thermally conductive material exhibits in a surface direction of the first thermally conductive material being higher than a thermal conductivity which the first thermally conductive material exhibits in a perpendicular direction of the first thermally conductive material, the perpendicular direction being a direction perpendicular to the surface direction, each of the through holes being formed so as to penetrate the first thermally conductive material in the perpendicular direction of the first thermally conductive material, each of the second thermally conductive materials being held by an inner surface of a corresponding one of the through holes, and having fitting strength of not less than 0.5 N/mm per unit circumference of the corresponding one of the through holes, a thermal conductivity which each of the second thermally conductive materials exhibits in the perpendicular direction of the first thermally conductive material being higher than the thermal conductivity which the first thermally conductive material exhibits in the perpendicular direction of the first thermally conductive material.

[2] A heat transport structure including: a first thermally conductive material in which through holes are formed; and second thermally conductive materials which are fitted in the respective through holes, a thermal conductivity which the first thermally conductive material exhibits in a surface direction of the first thermally conductive material being higher than a thermal conductivity which the first thermally conductive material exhibits in a perpendicular direction of the first thermally conductive material, the perpendicular direction being a direction perpendicular to the surface direction, each of the through holes being formed so as to penetrate the first thermally conductive material in the perpendicular direction of the first thermally conductive material, each of the second thermally conductive materials having a shape of a column having a bulged side surface, a thermal conductivity which each of the second thermally conductive materials exhibits in the perpendicular direction of the first thermally conductive material being higher than the thermal conductivity which the first thermally conductive material exhibits in the perpendicular direction of the first thermally conductive material.

[3] A heat transport structure including: a first thermally conductive material in which through holes are formed; and second thermally conductive materials which are fitted in the respective through holes, a thermal conductivity which the first thermally conductive material exhibits in a surface direction of the first thermally conductive material being higher than a thermal conductivity which the first thermally conductive material exhibits in a perpendicular direction of the first thermally conductive material, the perpendicular direction being a direction perpendicular to the surface direction, each of the through holes being formed so as to penetrate the first thermally conductive material in the perpendicular direction of the first thermally conductive material, surface roughness Rz of an inner surface of each of the through holes being not less than 3.5 μm, a thermal conductivity which each of the second thermally conductive materials exhibits in the perpendicular direction of the first thermally conductive material being higher than the thermal conductivity which the first thermally conductive material exhibits in the perpendicular direction of the first thermally conductive material.

[4] The heat transport structure as set forth in [1] or [3], wherein each of the second thermally conductive materials has a shape of a column having a bulged side surface.

[5] The heat transport structure as set forth in any one of [1] through [4], including: a plurality of fixing parts in which the second thermally conductive materials are held; and a heat transfer part which is located between the plurality of fixing parts.

[6] The heat transport structure as set forth in [5], wherein: the first thermally conductive material contains graphite; a thermal conductivity ($\lambda$1) which the heat transfer part exhibits in the surface direction and which is derived with use of a light alternating-current method is not less than 500 W/m·K; and a thermal conductivity which the heat transfer part exhibits in the perpendicular direction and which is derived with use of a frequency-changing method is not more than 25 W/m·K.

[7] The heat transport structure as set forth in [5] or [6], wherein: heat transfer efficiency ($\lambda$2/$\lambda$1) is not less than 0.60, the heat transfer efficiency ($\lambda$2/$\lambda$1) being calculated from (i) a thermal conductivity ($\lambda$1) which the heat transfer part exhibits in the surface direction and which is derived with use of a light alternating-current method and (ii) a thermal conductivity ($\lambda$2) which the heat transfer part exhibits in the surface direction and which is derived from temperatures of the heat transfer part which temperatures are measured in a case where heat is inputted in one of the plurality of fixing parts; and a thickness of the heat transfer part is not less than 100 µm.

[8] The heat transport structure as set forth in any one of [5] through [7], wherein a heat transfer density ($\lambda$2/D) is not less than 0.50 W·m$^2$/K·kg, the heat transfer density ($\lambda$2/D) being calculated from (i) a thermal conductivity ($\lambda$2) which the heat transfer part exhibits in the surface direction and which is derived from temperature distribution of the heat transfer part which temperature distribution is measured in a case where heat is inputted in one of the plurality of fixing parts and (ii) a density (D) of the heat transfer part.

[9] The heat transport structure as set forth in any one of [1] through [8], wherein a diameter of each of the through holes is not less than 0.20 mm and not more than 50.00 mm.

[10] A method of producing a heat transport structure, the method including: a through hole forming step of forming through holes in a first thermally conductive material so that the through holes extend in a perpendicular direction of the first thermally conductive material, the perpendicular direction being a direction perpendicular to a surface direction of the first thermally conductive material, a thermal conductivity which the first thermally conductive material exhibits in the surface direction of the first thermally conductive material being higher than a thermal conductivity which the first thermally conductive material exhibits in the perpendicular direction of the first thermally conductive material; an inserting step of inserting, into the respective through holes, second thermally conductive materials each of which has a shape of a column thinner than a corresponding one of the through holes; and a fitting step of fitting the second thermally conductive materials into the respective through holes by compressing the second thermally conductive materials in the perpendicular direction so that the second thermally conductive materials are expanded and deformed in the surface direction, a volume of each of the second thermally conductive materials being not less than 80% and not more than 150% relative to a volume of a corresponding one of the through holes.

[11] The method as set forth in [10], wherein a side surface of each of the second thermally conductive materials which have been subjected to the fitting step is bulged.

[12] The method as set forth in [10] or [11], wherein a thermal conductivity which each of the second thermally conductive materials exhibits in the perpendicular direction of the first thermally conductive material is higher than the thermal conductivity which the first thermally conductive material exhibits in the perpendicular direction of the first thermally conductive material.

[13] The method as set forth in any one of [10] through [12], wherein respective areas of an upper surface and a lower surface of each of the second thermally conductive materials which have not been subjected to the inserting step are each smaller, by not less than 3%, than an area of a corresponding one of the through holes.

[14] The method as set forth in any one of [10] through [13], wherein a thickness of each of the second thermally conductive materials which have not been subjected to the inserting step is greater, by not less than 5%, than a thickness of a corresponding one of the through holes.

Advantageous Effects of Invention

According to an embodiment of the present invention, it is possible to provide a heat transport structure which is so excellent in heat transfer efficiency that heat can be smoothly transferred.

BRIEF DESCRIPTION OF DRAWINGS

FIG. 5 is a top view of the heat transport structure in accordance with an embodiment of the present invention, and illustrates a preferable embodiment of the fitting step included in the method of producing the heat transport structure.

FIG. 6 is a cross-sectional view of the heat transport structure in accordance with an embodiment of the present invention, and illustrates a preferable embodiment of second thermally conductive materials of the heat transport structure.

DESCRIPTION OF EMBODIMENTS

The following description will discuss an embodiment of the present invention. Note, however, that the present invention is not limited to such an embodiment.

Figure 1:
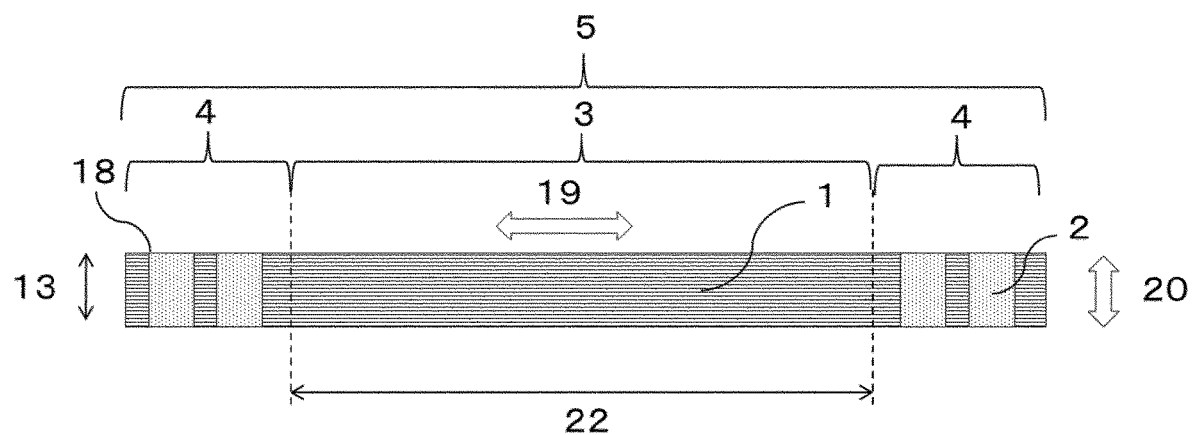
FIG. 1 is a cross-sectional view of a heat transport structure in accordance with an embodiment of the present invention, as viewed from a side of the heat transport structure.
Figure 2:
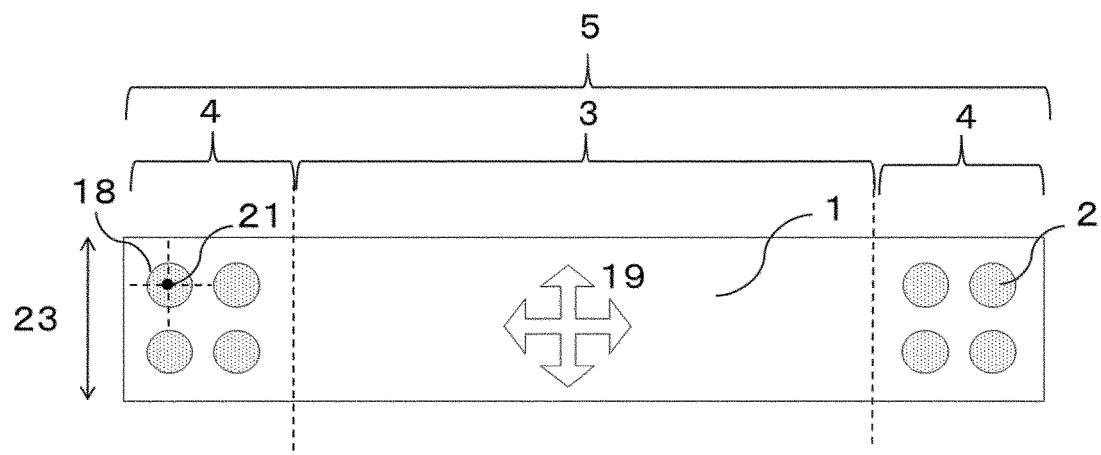
FIG. 2 is a top view of the heat transport structure in accordance with an embodiment of the present invention.

As illustrated in FIGS. 1 and 2, a heat transport structure 5 in accordance with an embodiment of the present invention is for transporting heat from a given location to another location which is apart from the given location. The heat transport structure 5 includes a first thermally conductive material 1 and second thermally conductive materials 2. The heat transport structure 5 preferably has (i) fixing parts 4 in which the second thermally conductive materials 2 are held and (ii) a heat transfer part 3 which is located between the fixing parts 4.

First Thermally Conductive Material A first thermally conductive material in accordance with an embodiment of the present invention will be described below. A thermal conductivity which the first thermally conductive material exhibits in a surface direction is higher than a thermal conductivity which the first thermally conductive material exhibits in a perpendicular direction. Note that the surface direction indicates a direction parallel to a planar direction of the first thermally conductive material having a substantially planar shape, and indicates a surface direction 19 which is shown by arrows in FIGS. 1 and 2. Note also that the perpendicular direction indicates a direction perpendicular to the planar direction of the first thermally conductive material, and indicates a perpendicular direction 20 which is shown by arrows in FIGS. 1 and 2.

Note that the phrase "a thermal conductivity which the first thermally conductive material exhibits in a surface direction is higher" means that the first thermally conductive material 1 has a structure that is aligned in the surface direction 19. Due to the fact that the first thermally conductive material 1 has a higher thermal conductivity in the surface direction 19, it is possible to efficiently transfer heat in the surface direction 19. Furthermore, due to the fact that the first thermally conductive material has a structure that is aligned in the surface direction 19, each of the second thermally conductive materials 2 is low in slidability with respect to the first thermally conductive material 1 and is accordingly excellent in fitting strength per unit circumference of a corresponding one of through holes 18.

The first thermally conductive material 1 can be constituted by a single sheet material or can be alternatively constituted by a plurality of sheet materials which are stacked on one another.

The first thermally conductive material 1 has the through holes 18. Each of the through holes 18 is formed so as to penetrate the first thermally conductive material 1 in the perpendicular direction 20 of the first thermally conductive material 1. Note that the perpendicular direction 20 indicates a thickness direction of the first thermally conductive material and is not necessarily at 90 degrees relative to the planar direction. For example, the perpendicular direction 20 can be inclined by an angle of not more than 20 degrees, by an angle of not more than 10 degree, or by an angle of not more than 5 degrees, from a direction at 90 degrees relative to a horizontal direction.

According to an embodiment of the present invention, a material by which the first thermally conductive material 1 is constituted can be selected as appropriate, provided that the thermal conductivity which the first thermally conductive material 1 exhibits in the surface direction 19 will be a higher than the thermal conductivity which the first thermally conductive material 1 exhibits in the perpendicular direction 20. In view of an increase in thermal conductivity, the material by which the first thermally conductive material 1 is constituted is preferably a material containing graphite, a material containing metal foil and a resin (more specifically, a material made of metal foil and a resin), or the like, and is particularly preferably a material containing graphite.

(Kinds of Material Containing Graphite)

Specific examples of the material containing graphite used as the first thermally conductive material encompass a "plate-shaped material made of merely graphite," a "material obtained by molding graphite powder into a plate or a sheet," and a "laminated material made up of a graphite sheet and an adhesive layer." Each of those materials has such a structure that crystals of graphite are aligned in a surface direction. Therefore, a thermal conductivity which each of the materials exhibits in the surface direction is higher than a thermal conductivity which the each of the materials exhibits in a perpendicular direction. The material containing graphite is preferably a "laminated material made up of a graphite sheet and an adhesive layer" in that such a laminated material is excellent in thermal conductivity in the surface direction 19 and causes each of the second thermally conductive materials 2 to be excellent in fitting strength per unit circumference of a corresponding one of the through holes.

(Kinds of Graphite Sheet)

The graphite sheet is not limited to any particular kind, and can be a polymeric graphite sheet (later described) or can be a graphite sheet obtained by expanding natural graphite which is a raw material. The polymeric graphite sheet has a high thermal conduction property, and is therefore capable of exhibiting higher thermal performance.

A first method for producing the graphite sheet used in an embodiment of the present invention is a method of obtaining a graphite sheet by expanding natural graphite which is a raw material. Specifically, graphite powder is immersed in an acid such as sulfuric acid so as to obtain a graphite intercalation compound, and thereafter the graphite intercalation compound is heat-treated so that the graphite intercalation compound is expanded and, accordingly, graphite layers are detached from each other. After the graphite layers are detached from each other, the graphite powder is washed so that the acid is removed. The graphite powder thus obtained is pressed and rolled so as to be molded. In this way, a graphite sheet is obtained.

A second method for producing the graphite sheet preferably used for the object of the present invention is a method of preparing a polymeric graphite sheet by heat-treating a polymeric film made of, for example, a polyimide resin. Specifically, a polymeric film which is a starting material is preheated to approximately 1,000° C. under reduced pressure or in an inert gas so as to be carbonated. After a carbonated film is thus obtained, the carbonated film is heat-treated to a temperature of not less than 2,800° C. in an inert gas atmosphere so as to be graphitized. In this way, a graphite sheet, having a good graphite crystal structure and an excellent thermal conduction property, is obtained.

(Second Thermally Conductive Material)

A second thermally conductive material in accordance with an embodiment of the present invention will be described below. A thermal conductivity which the second thermally conductive material exhibits in the perpendicular direction of the first thermally conductive material is higher than the thermal conductivity which the first thermally conductive material exhibits in the perpendicular direction of the first thermally conductive material. Since the thermal conductivity which the second thermally conductive material exhibits in the perpendicular direction of the first thermally conductive material is higher than the thermal conductivity which the first thermally conductive material exhibits in the perpendicular direction of the first thermally conductive material, it is possible to obtain a heat transport structure which allows heat to be smoothly transferred.

In an embodiment of the present invention, the second thermally conductive material is not limited to any particular material. A material by which the second thermally conductive material is constituted can be selected as appropriate, provided that the thermal conductivity which the second thermally conductive material exhibits in the perpendicular direction of the first thermally conductive material will be higher than the thermal conductivity which the first thermally conductive material exhibits in the perpendicular direction of the first thermally conductive material. In view of the thermal conductivity, the material by which the second thermally conductive material is constituted is preferably a metal material, a ceramic material, a graphite material, or a composite material made up of any of those materials. In particular, the material by which the second thermally conductive material is constituted is preferably gold, silver, copper, aluminum, nickel, SUS, each of which is a ductile metal material, or a composite material made up of any of those materials, because each of those materials is deformed through a fitting step and is excellent in fitting strength per unit circumference of a through hole. In a case where the second thermally conductive material is constituted by a composite material (for example, an upper part of the second thermally conductive material is constituted by a material A and a lower part of the second thermally conductive material is constituted by a material B), it is possible to cause the second thermally conductive material to have a plurality of bulges on its side surface (later described), which bulges result from a difference in strength between the material A and the material B (in other words, a difference in ease of compression between the material A and the material B in a case where a force is applied to each of the material A and the material B).

In a case where the first thermally conductive material is constituted by the material containing graphite, the second thermally conductive material is preferably constituted by a material that causes the thermal conductivity which the second thermally conductive material exhibits in the perpendicular direction of the first thermally conductive material to be preferably not less than twice, more preferably not less than 10 times, still more preferably not less than 40 times as high as the thermal conductivity which the first thermally conductive material exhibits in the perpendicular direction of the first thermally conductive material, in view of obtainment of a heat transport structure which allows heat to be transferred more smoothly.

The second thermally conductive material is not limited to any particular shape, but the second thermally conductive material preferably has a columnar shape. In this case, the second thermally conductive material can have a shape of a straight column, but preferably has a shape of a column having a bulged side surface, in view of an improvement in fitting strength. Note that, as used herein, the "shape of a column having a bulged side surface" intends a shape of a column which has a side surface having a region that is projected outward.

More specifically, the second thermally conductive material can have a side surface which is continuously bulged or can alternatively have a side surface which is bulged stepwise. In view of ease of production of the heat transport structure in accordance with an embodiment of the present invention (for example, ease of insertion of the second thermally conductive material into the through hole), the second thermally conductive material preferably has a side surface which is continuously bulged. Note that the side surface can have a single bulge or can alternatively have a plurality of bulges.

More specifically, the second thermally conductive material preferably has an upper surface and a lower surface. A shape of the upper surface can be identical to that of the lower surface or can be alternatively different from that of the lower surface. However, in view of ease of production of the heat transport structure in accordance with an embodiment of the present invention (for example, ease of insertion of the second thermally conductive material into the through hole), the shape of the upper surface is preferably identical to that of the lower surface. An area of the upper surface can be identical to that of the lower surface or can be alternatively different from that of the lower surface. However, in view of ease of production of the heat transport structure in accordance with an embodiment of the present invention (for example, ease of insertion of the second thermally conductive material into the through hole), the area of the upper surface is preferably identical to that of the lower surface. The columnar shape is not limited to any particular one, and specific examples of the columnar shape encompass a cylindrical shape and a polygonal columnar shape.

As illustrated in FIG. 6, that the second thermally conductive material 2 has a shape of a cylinder having a bulged side surface indicates that the second thermally conductive material 2 has the following shape. That is, part 17 of the second thermally conductive material 2 in which part the side surface of the second thermally conductive material 2 is bulged has a diameter greater than any greater one of respective diameters of an upper surface 24 and a lower surface 16 of the second thermally conductive material 2. In a case where the second thermally conductive material does not have such a cylindrical shape, the second thermally conductive material can have the following columnar shape. That is, a diameter of a circle circumscribed around the part 17 of the second thermally conductive material, in which part the side surface of the second thermally conductive material is bulged, is greater than any greater one of (i) a diameter of a circle circumscribed around the upper surface 24 of the second thermally conductive material and (ii) a diameter of a circle circumscribed around the lower surface 16 of the second thermally conductive material. Note that the case where the second thermally conductive material does not have a cylindrical shape indicates, for example, a case where the upper surface or the lower surface of the second thermally conductive material 2 has a pseudo circular shape or a polygonal shape.

In a case where the second thermally conductive material has a cylindrical shape, the respective diameters of the upper surface and the lower surface of the second thermally conductive material are each preferably not less than 0.20 mm and not more than 50.00 mm. In view of a lateral area per volume of the second thermally conductive material, the respective diameters of the upper surface and the lower surface of the second thermally conductive material are each particularly preferably not less than 1.00 mm and not more than 30.00 mm. In a case where the respective diameters of the upper surface and the lower surface of the second thermally conductive material each fall within such a preferable range, it is possible to transfer heat between the first thermally conductive material and the second thermally conductive material more smoothly. Note that the through hole is not limited to a circular shape, and can have a pseudo circular shape, a polygonal shape, or the like. However, in view of the fitting strength, the through hole preferably has a circular shape.

In a case where the second thermally conductive material has a preferable shape, that is, a shape of a cylinder having a bulged side surface (see FIG. 6), how much the side surface is bulged is not limited in particular. However, in view of excellence in fitting strength, the diameter of the part 17 of the second thermally conductive material, in which part the side surface of the second thermally conductive material is bulged, is greater, by preferably not less than 0.1 mm and not more than 2 mm, more preferably not less than 0.3 mm and not more than 1 mm, than any greater one of the respective diameters of the upper surface 24 and the lower surface 16 of the second thermally conductive material. A ratio (B1/A1) of a diameter (B1) of a cross section of the part 17 of the second thermally conductive material 2, in which part the side surface of the second thermally conductive material 2 is bulged (for example, the part 17 in which the side surface of the second thermally conductive material 2 is most bulged), to any greater one (A1) of the respective diameters of the upper surface 24 and the lower surface 16 of the second thermally conductive material 2 is more preferably not less than 1.01, and most preferably not less than 1.05. In a case where the second thermally conductive material does not have such a cylindrical shape, a ratio (B2/λ2) of a diameter (B2) of a circle circumscribed around a cross section of the part 17 of the second thermally conductive material 2, in which part the side surface of the second thermally conductive material 2 is bulged (for example, the part 17 in which the side surface of the second thermally conductive material 2 is most bulged), to any greater one (A2) of (i) a diameter of a circle circumscribed around the upper surface 24 of the second thermally conductive material 2 and (ii) a diameter of a circle circumscribed around the lower surface 16 of the second thermally conductive material 2 is preferably not less than 1.01, and most preferably not less than 1.05.

The second thermally conductive material 2 has a thickness of preferably not less than 100 μm and not more than 5,000 μm, and more preferably not less than 200 μm and not more than 1,000 μm, in view of enhancement of heat transport performance of the heat transport structure.

(Fitting of Second Thermally Conductive Material)

The second thermally conductive material in accordance with an embodiment of the present invention is fitted in the through hole formed in the first thermally conductive material. The second thermally conductive material is held by an inner surface of the through hole. This allows heat to be smoothly transferred between the first thermally conductive material and the second thermally conductive material.

That the second thermally conductive material in accordance with an embodiment of the present invention is fitted in the through hole formed in the first thermally conductive material means the following state. That is, the second thermally conductive material and the through hole, which is formed in the first thermally conductive material, are fitted together such that the shape of the second thermally conductive material is complementary to the shape of the through hole. That the second thermally conductive material is held by the inner surface of the through hole means the following state. That is, the second thermally conductive material is held by the first thermally conductive material, by the side surface of the second thermally conductive material and the inner surface of the through hole, which is formed in the first thermally conductive material, being fitted together while being in contact with each other (for example, by the side surface of the second thermally conductive material and the inner surface of the through hole being tightly fitted together while being in close contact with each other).

The second thermally conductive material in accordance with an embodiment of the present invention has, with respect to the first thermally conductive material, fitting strength of not less than 0.5 N/mm per unit circumference of the through hole formed in the first thermally conductive material. Since the fitting strength per unit circumference of the through hole is not less than 0.5 N/mm, it is possible to obtain a heat transport structure which is so excellent in heat transfer efficiency that heat can be smoothly transferred between the first thermally conductive material and the second thermally conductive material.

(Evaluation of Fitting Strength Per Unit Circumference of Through Hole)

The fitting strength, per unit circumference of the through hole, in accordance with an embodiment of the present invention (hereinafter, merely referred to "fitting strength") is evaluated as follows. That is, the first thermally conductive material 1 of the heat transport structure 5 illustrated in FIGS. 1 and 2 is fixed, and a load is imposed on a central part 21, in the surface direction 19, of the second thermally conductive material 2. A value of the load at a time when the second thermally conductive material 2 falls off the first thermally conductive material 1 is divided by a value of any longer one of respective circumferences of the upper surface 24 and the lower surface 16 of the second thermally conductive material 2, each of which circumferences has been measured before the load is imposed on the central part 21 of the second thermally conductive material 2. A value thus obtained is evaluated as the fitting strength.

(Surface Roughness of Inner Surface of through Hole Formed in First Thermally Conductive Material)

Surface roughness Rz of the inner surface of the through hole formed in the first thermally conductive material is calculated as an average value of two values measured, in conformance with JISB0601•2001, at respective two points on the inner surface of the through hole formed in the first thermally conductive material.

The inner surface of the through hole formed in the first thermally conductive material has surface roughness Rz of preferably not less than 3.5 μm, more preferably not less than 3.5 μm and not more than 200 μm, still more preferably not less than 5 μm and not more than 180 μm, most preferably not less than 6 μm and not more than 150 μm.

In a case where the inner surface of the through hole formed in the first thermally conductive material has surface roughness Rz of not less than 3.5 μm, thermal contact is promoted when the second thermally conductive material is fitted into the first thermally conductive material. Therefore, the inner surface of the through hole preferably has surface roughness Rz of not less than 3.5 μm. In particular, in a case where the first thermally conductive material is constituted by a graphite sheet, the graphite sheet is in a state of protruding from the through hole. Accordingly, when the second thermally conductive material is fitted into the first thermally conductive material which is constituted by the graphite sheet, the graphite sheet is bent, and the second thermally conductive material is brought into contact with not only an end surface of the graphite sheet but also a surface of the graphite sheet. This promotes transfer of heat between the first thermally conductive material and the second thermally conductive material. Therefore, the inner surface of the through hole preferably has surface roughness Rz of not less than 3.5 μm.

In a case where the inner surface of the through hole formed in the first thermally conductive material has surface roughness Rz of not more than 200 μm, this causes (i) an increase in adhesiveness between the first thermally conductive material and the second thermally conductive material and (ii) an increase in area of part of the first thermally conductive material which part is in contact with the second thermally conductive material. Therefore, the inner surface of the through hole preferably has surface roughness Rz of not more than 200 μm. In particular, since, in a case where the first thermally conductive material is constituted by a graphite sheet, it is possible to prevent powder from falling from the graphite sheet when the second thermally conductive material is fitted into the first thermally conductive material, the inner surface of the through hole preferably has surface roughness Rz of not more than 200 μm.

(Fixing Part)

A fixing part in accordance with an embodiment of the present invention will be described below. The fixing part indicates part of the heat transport structure 5 which part receives heat from a heat source or passes heat to a cooling source, and is illustrated with a reference numeral of 4 in FIGS. 1 and 2. That is, the fixing part 4 includes the second thermally conductive material 2 and part of the first thermally conductive material 1 which part holds the second thermally conductive material 2. The heat source is defined as a place where heat is generated. Examples of the heat source encompass a device, such as a CPU, disposed inside an electronic device in operation. The cooling source is defined as a place where heat is absorbed. Assuming that the heat source is a CPU disposed inside an electronic device in operation, examples of the cooling source encompass a fin and a Peltier device each provided to a body housing of the electronic device or provided to the electronic device. According to an embodiment of the present invention, two or more fixing parts can be provided to a single heat transport structure so that heat can be transferred from the heat source to the cooling source. In a case where a single heat transport structure has three or more fixing parts, it is possible to attach a plurality of heat sources to the single heat transport structure via respective ones of the three or more fixing parts. According to such a heat transport structure, it is possible to simultaneously pass, to the cooling source, heat generated from the plurality of heat sources. Alternatively, it is possible to attach a plurality of cooling sources to the single heat transport structure via respective ones of the three or more fixing parts. According to such a heat transport structure, it is possible to simultaneously pass, to the plurality of cooling sources, heat generated from the heat source. As such, the heat transport structure preferably has three or more fixing parts because such a heat transport structure causes a reduction in number of members for transporting heat.

It is only necessary that a single fixing part includes at least one second thermally conductive material. Note, however, that the heat transport structure is preferably configured such that a single fixing part includes a plurality of second thermally conductive materials, because such a configuration allows heat to be smoothly transferred between the first thermally conductive material and the plurality of second thermally conductive materials. The heat transport structure is more preferably configured such that a single fixing part includes 4 to 10 second thermally conductive materials. According to the heat transport structure which includes the second thermally conductive materials the number of which is a preferable number, it is possible to smoothly transfer heat between the first thermally conductive material and the second thermally conductive materials.

A size and a planar shape of the fixing part in accordance with an embodiment of the present invention are each not limited in particular, provided that the fixing part includes the second thermally conductive material 2. The size and the planar shape of the fixing part can be determined as appropriate depending on a size of the heat source or the cooling source. In view of smooth transfer of heat, the size of the fixing part is preferably similar to that of the heat source or the cooling source. The size of the fixing part is preferably such a size that the fixing part has a shape of a polygon (for example, a square) measuring not less than 5 mm and not more than 200 mm per side, and is more preferably such a size that the fixing part has a shape of a polygon (for example, a square) measuring not less than 10 mm and not more than 100 mm per side. This is because heat is easily transferred from the heat source to the cooling source smoothly.

According to an embodiment of the present invention, a thickness of the fixing part is not limited in particular. However, the thickness of the fixing part is preferably not less than 100 μm and not more than 50 mm, more preferably not less than 300 μm and not more than 10 mm, because it is possible to easily obtain a heat transport structure which is excellent in heat transport performance.

The second thermally conductive materials are preferably arranged uniformly at regular intervals in each of the fixing parts because such arrangement causes (i) heat, generated by the heat source, to be uniformly received by one of the fixing parts and (ii) the heat to be easily transferred uniformly from the other one of the fixing parts to a cooling section.

(Heat Transfer Part)

The heat transfer part in accordance with an embodiment of the present invention will be described below. The heat transfer part indicates part of the heat transport structure which part is located between the fixing parts, and is illustrated with a reference numeral of 3 in FIGS. 1 and 2. The heat transfer part 3 is part for transferring heat from one of the fixing parts 4, which one has received the heat from the heat source, to the other one of the fixing parts 4, which other one is to pass the heat to the cooling source. For accomplishment of such a purpose, one of the fixing parts 4 in accordance with an embodiment the present invention is part which receives heat generated from the heat source, and the other one of the fixing parts 4 is part which passes the heat to the cooling source. The heat transfer part 3 is sandwiched between such fixing parts 4.

According to an embodiment of the present invention, a length 22 (see FIGS. 1 and 2) of the heat transfer part 3 is not limited in particular. However, the length 22 is preferably not less than 30 mm and not more than 500 mm, in view of obtainment of a heat transport structure which is good in transfer of heat.

According to an embodiment of the present invention, a width 23 (see FIG. 2) of the heat transfer part 3 is not limited in particular. However, the width 23 is preferably not less than 5 mm and not more than 200 mm, more preferably not less than 10 mm and not more than 100 mm, in view of obtainment of a heat transport structure which is good in transfer of heat.

According to an embodiment of the present invention, a thickness 13 (see FIG. 1) of the heat transfer part 3 is not limited in particular. However, the thickness 13 is preferably not less than 50 μm and not more than 5,000 μm, more preferably not less than 100 μm and not more than 1,000 μm, in view of obtainment of a heat transport structure which is good in transfer of heat.

According to an embodiment of the present invention, a planar shape of the heat transfer part 3 is not limited in particular, and can be any planar shape, such as a planar rectangular shape and a planar trapezoidal shape, which has straight sides or curved sides. Note, however, that the heat transfer part 3 preferably has a rectangular shape having straight sides, in that such a shape allows (i) the heat transfer part 3 to be good in transfer of heat and (ii) heat to be transferred along the shortest route.

According to an embodiment of the present invention, the first thermally conductive material which forms the heat transfer part is preferably constituted by the material containing graphite. The material containing graphite is preferably such a material that (i) a thermal conductivity ($\lambda 1$) which the heat transfer part exhibits in the surface direction and which is derived with use of a light alternating-current method is not less than 500 W/m·K and (ii) a thermal conductivity which the heat transfer part exhibits in the perpendicular direction and which is derived with use of a frequency-changing method is not more than 25 W/m·K.

(Thermal Conductivity in Surface Direction Which Thermal Conductivity is Derived with Use of Light Alternating-Current Method)

The thermal conductivity ($\lambda 1$) which the heat transfer part in accordance with an embodiment of the present invention exhibits in the surface direction can be determined by (i) measuring, by the light alternating-current method, thermal diffusivity which graphite contained in the first thermally conductive material exhibits in the surface direction and (ii) substituting the thermal diffusivity into the following expression (1).

[Math. 1]

$$\lambda 1 = \alpha \times d \times Cp \qquad (1)$$

where: $\lambda 1$ represents a thermal conductivity of the first thermally conductive material; a represents thermal diffusivity of the first thermally conductive material; d represents a density of the first thermally conductive material; and Cp represents a specific heat capacity of the first thermally conductive material. Note that thermal diffusivity which the material containing graphite exhibits in the surface direction, a density of the material containing graphite, and a specific heat capacity of the material containing graphite can be determined by methods described below. Note also that, in a case where an outer surface of the material containing graphite is covered with a resin film or a resin tape, it is necessary to (i) remove the resin film or the resin tape so that the material containing graphite is exposed and then (ii) measure the thermal diffusivity, the density, and the specific heat capacity of the material containing graphite.

(Measurement of Thermal Diffusivity, which Material Containing Graphite Exhibits in Surface Direction, by Light Alternating-Current Method)

The thermal diffusivity which the material containing graphite exhibits in the surface direction can be measured in the following manner. That is, thermal diffusivity of a graphite sample measuring 4 mm×40 mm is measured with use of a LaserPit, which is a thermal diffusivity measuring device that is manufactured by ULVAC-RIKO, Inc. and that employs the light alternating-current method, in an atmosphere of 20° C., and under an alternating current of 10 Hz.

(Measurement of Specific Heat Capacity of Material Containing Graphite)

The specific heat capacity of the material containing graphite can be measured with use of a differential scanning calorimeter DSC220CU, which is a thermal analysis system manufactured by SII NanoTechnology Inc., under a condition that a temperature is raised from 20° C. to 260° C. at a rate of 10° C./min.

(Measurement of Density of Material Containing Graphite)

The density of the material containing graphite can be determined by (i) measuring a weight and a thickness of a sample measuring 100 mm×100 mm and (ii) dividing a value of a measured weight by a value of a measured volume.

(Thermal Conductivity Which Material Containing Graphite Exhibits in Surface Direction and which is Derived with Use of Light Alternating-Current Method)

The thermal conductivity ($\lambda 1$) which the heat transfer part, constituted by the material containing graphite, exhibits in the surface direction and which is derived with use of the light alternating-current method is preferably not less than 500 W/m·K, more preferably not less than 1,000 W/m·K, still more preferably not less than 1,200 W/m·K. In a case where the thermal conductivity which the heat transfer part exhibits in the surface direction is not less than 500 W/m·K, it is possible to obtain a heat transport structure which has high thermal performance. Furthermore, since the first thermally conductive material, which forms the heat transfer part, contains graphite, it is possible to considerably reduce a weight of the heat transport structure and also contribute to a reduction in weight of an electronic device, as compared with a case where a thermally conductive material made of metal such as copper and aluminum is used.

(Thermal Conductivity in Perpendicular Direction which Thermal Conductivity is Derived with Use of Frequency-Changing Method)

The thermal conductivity which the heat transfer part in accordance with an embodiment of the present invention exhibits in the perpendicular direction can be determined by (i) measuring, by the frequency-changing method, thermal diffusivity which the material containing graphite exhibits in the perpendicular direction and (ii) substituting the thermal diffusivity into the expression (1). Thermal diffusivity which the first thermally conductive material exhibits in the perpendicular direction can be measured in the following manner. That is, thermal diffusivity of a sample measuring 20 mm×20 mm, which sample has been cut from the material containing graphite, is measured by the frequency-changing method, with use of a thermowave analyzer TA3, which is a thermophysical property measuring device manufactured by Bethel Co., Ltd., in an atmosphere of 20° C.

The thermal conductivity which the heat transfer part in accordance with an embodiment of the present invention exhibits in the perpendicular direction is preferably not more than 25 W/m·K. In a case where (i) the heat transfer part is constituted by the material containing graphite and (ii) the thermal conductivity which the heat transfer part exhibits in the perpendicular direction is not more than 25 W/m·K, graphite is high in alignment. This causes the second thermally conductive material not to easily slide on the first thermally conductive material, and ultimately causes the fitting strength to be easily increased.

(Measurement of Thickness of Heat Transfer Part)

The thickness of the heat transfer part can be measured in the following manner. That is, thicknesses at 10 given locations of the heat transfer part are measured in a thermostatic chamber at 25° C. with use of HE1DENH:AIN-CERTO, which is a thickness gauge manufactured by Heidenhain Corporation. An average value of the thicknesses is deemed as the thickness of the heat transfer part.

(Heat Transfer Efficiency)

According to an embodiment of the present invention, the heat transfer efficiency ($\lambda 2/\lambda 1$) is preferably not less than 0.60, the heat transfer efficiency ($\lambda 2/\lambda 1$) being calculated from (i) the thermal conductivity ($\lambda 1$) which the heat transfer part exhibits in the surface direction and which is derived with use of the light alternating-current method and (ii) a thermal conductivity ($\lambda 2$) which the heat transfer part exhibits in the surface direction and which is derived from temperatures of the heat transfer part which temperatures are measured in a case where heat is inputted in one of the fixing parts. In this case, the thickness of the heat transfer part is preferably not less than 100 μm.

(Thermal Conductivity in Surface Direction Which Thermal Conductivity is Derived from Temperatures)

Figure 3:
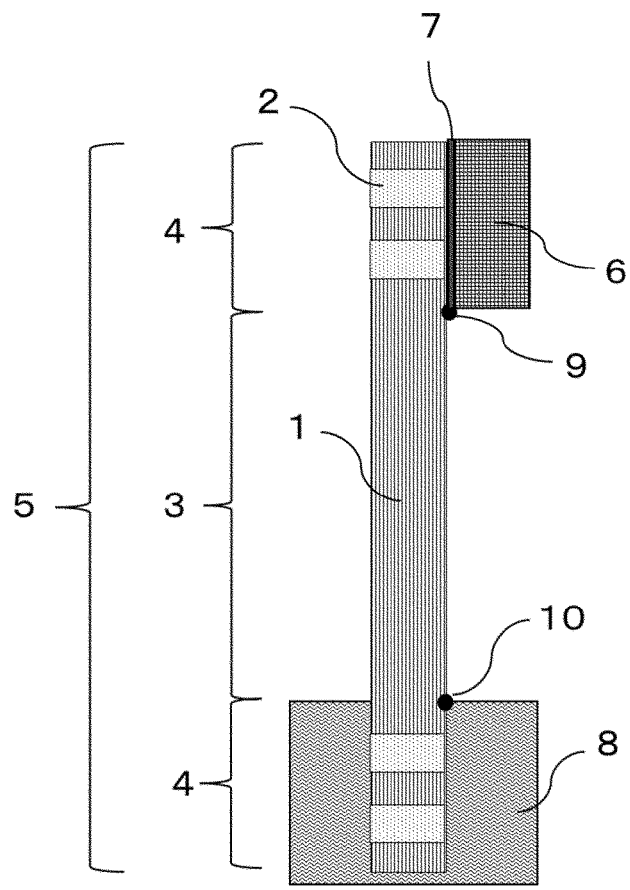
FIG. 3 is a cross-sectional view of the heat transport structure in accordance with an embodiment of the present invention, as viewed from the side of the heat transport structure, and illustrates how to measure temperatures of a heat transfer part of the heat transport structure.

FIG. 3 illustrates how to measure the thermal conductivity ($\lambda 2$) in the surface direction. The thermal conductivity ($\lambda 2$) which the heat transfer part 3 in accordance with an embodiment of the present invention exhibits in the surface direction can be determined by (i) connecting a heater 6 to one of the fixing parts 4, (ii) immersing the other one of the fixing parts 4 in a water bath 8, (iii) measuring a difference in temperature between temperature sensing parts 9 and 10 which are located at respective both ends of the heat transfer part 3, and then (iv) substituting the difference in temperature into the following expression (2).

[Math. 2]

$$\lambda 2 = P \times L / A / T \qquad (2)$$

where: P represents an output of the heater 6; L represents a length of heat transfer part 3; A represents an area of a cross section of the heat transfer part 3; T represents a difference in temperature between the temperature sensing parts located at the respective both ends of the heat transfer part 3.

That is, $\lambda 2$ indicates the thermal conductivity of the entire heat transfer part 3, and $\lambda 1$ indicates the thermal conductivity of graphite contained in the heat transfer part 3. It can be said that, in a case where a value of $\lambda 2/\lambda 1$ is high (as the value becomes closer to "1"), the heat transport structure brings out ability of graphite.

Note that, as an embodiment of the present invention, a case is assumed where the heat transport structure includes a large planar element as part of a constituent element. In this case, it may not be possible to measure the thermal conductivity ($\lambda 2$) in the surface direction by a method illustrated in FIG. 3 due to dimensions of the large planar element. In such a case, it is possible to measure the thermal conductivity ($\lambda 2$) in the surface direction by the method illustrated in FIG. 3 with use of a piece cut from the large planar element, thereby measuring the heat transfer efficiency.

(Heat Transfer Density)

A heat transfer density ($\lambda 2/D$) is preferably not less than 0.50 W·m²/K·kg, the heat transfer density ($\lambda 2/D$) being calculated from (i) the thermal conductivity ($\lambda 2$) which the heat transfer part exhibits in the surface direction and which is derived from temperature distribution of the heat transfer part which temperature distribution is measured in a case where heat is inputted in one of the fixing parts and (ii) a density (D) of the heat transfer part. The heat transfer density ($\lambda 2/D$) is calculated by dividing the thermal conductivity ($\lambda 2$), which the heat transfer part exhibits in the surface direction, by the density (D) of the heat transfer part. The thermal conductivity ($\lambda 2$) which the heat transfer part exhibits in the surface direction is derived from temperature distribution of the heat transfer part which temperature distribution is measured in a case where heat is inputted in one of the fixing parts. Note that the density (D) of the heat transfer part is determined by (i) measuring a weight and a thickness of a sample, measuring 100 mm×100 mm, of the first thermally conductive material, and (ii) dividing a value of the weight by a value of a volume. In a case where the heat transfer density ($\lambda 2/D$) is not less than 0.50 W·m²/K·kg, it can be said that the heat transport structure is capable of transporting heat with a high density.

(Method of Producing Heat Transport Structure)

A method of producing the heat transport structure in accordance with an embodiment of the present invention includes: producing the first thermally conductive material and the second thermally conductive materials; a through hole forming step of forming the through holes in the first thermally conductive material so that the through holes extend in the perpendicular direction of the first thermally conductive material; an inserting step of inserting the second thermally conductive materials into the respective through holes; and a fitting step of fitting the second thermally conductive materials into the respective through holes by compressing the second thermally conductive materials in the perpendicular direction so that the second thermally conductive materials are expanded and deformed in the surface direction.

(Method of Producing First Thermally Conductive Material)

The first thermally conductive material is preferably constituted by any one of the "laminated material made up of a graphite sheet and an adhesive layer" and the "plate-shaped material made of merely graphite" in view of achievement of both of the thermal conductivity and the fitting strength.

Examples of a resin of which the adhesive layer of the "laminated material made up of a graphite sheet and an adhesive layer" is made encompass thermosetting resins and thermoplastic resins.

Examples of the thermosetting resins encompass polyurethane (PU), phenol resin, urea resin, melamine-based resin, guanamine resin, vinylester resin, unsaturated polyester, Oligoester acrylate, diallyl phthalate, DKF resin (kind of resorcinol-based resin), xylene resin, epoxy resin, furan resin, polyimide (PI)-based resin, polyetherimide (PEI) resin, polyamide imide (PAI) resin, and polyphenylene ether (PPE). Among these examples, a resin containing an epoxy resin and/or an urethane resin is preferable because such a resin offers wide varieties of material options and has excellent adhesiveness with respect to a graphite sheet.

Examples of the thermoplastic resins encompass ionomer, isobutylene maleic anhydride copolymer, acrylonitrile-acryl-styrene copolymer (AAS), acrylonitrile-ethylene-styrene copolymer (AES), acrylonitrile-styrene copolymer (AS), acrylonitrile-butadiene-styrene copolymer (ABS), acrylonitrile-chlorinated polyethylene-styrene copolymer (ACS), methyl methacrylate-butadiene-styrene copolymer (MBS), ethylene-vinyl chloride copolymer, ethylene-vinyl acetate copolymer (EVA), ethylene-vinyl acetate copolymer (EVA)-based resin, ethylene vinyl alcohol copolymer (EVOH), polyvinyl acetate, chlorinated vinyl chloride, chlorinated polyethylene, chlorinated polypropylene, carboxy vinyl polymer, ketone resin, norbornene resin, vinyl propionate, polyethylene (PE), polypropylene (PP), polymethylpentene (TPX), polybutadiene, polystyrene (PS), styrene-maleic anhydride copolymer, methacryl, ethylene-methacrylic acid copolymer (EMAA), polymethylmethacrylate (PMMA), polyvinyl chloride (PVC), polyvinylidene chloride, polyvinyl alcohol (PVA), polyvinyl ether, polyvinyl butyral, polyvinyl formal, cellulose-based resin, nylon 6, nylon 6 copolymer, nylon 66, nylon 610, nylon 612, nylon 11, nylon 12, copolymer nylon, nylon MXD, nylon 46, methoxymethylated nylon, aramid, polyethylene terephthalate (PET), polybutylene terephthalate (PBT), polycarbonate (PC), polyacetal (POM), polyethylene oxide, polyphenylene ether (PPE), modified polyphenylene ether (PPE), polyether ether ketone (PEEK), polyether sulfone (PES), polysulfone (PSO), polyamine sulfone, polyphenylene sulfide (PPS), polyalylate (PAR), poly-para-vinyl phenol, poly-para-methylene styrene, polyallylamine, aromatic polyester, liquid crystal polymer, polytetrafluoroethylene (PTFE), tetrafluoroethylene-ethylene copolymer (ETFE), tetrafluoroethylene-hexafluoropropylene copolymer (FEP), tetrafluoroethylene-hexafluoro propylene-perfluoroalkyl vinyl ether copolymer (EPE), tetrafluoroethylene-perfluoroalkyl vinyl ether copolymer (PFA), polychlorotrifluoroethylene copolymer (PCTFE), ethylene-chlorotrifluoroethylene copolymer (ECTFE), polyvinylidene fluoride (PVDF)-based resin, and polyvinyl fluoride (PVF).

Any of these thermosetting resins and thermoplastic resins, each of which thermosetting resins and thermoplastic resins can be used to form an adhesive layer, is dissolved in water or an organic solvent so as to obtain an adhesive. The adhesive thus obtained is applied to a graphite sheet so that an adhesive layer is formed on the graphite sheet. The graphite sheet on which the adhesive layer is formed is caused to adhere to another graphite sheet. This makes it possible to produce the "laminated body made up of a graphite sheet and an adhesive layer." Alternatively, any of these thermosetting resins and thermoplastic resins, each of which thermosetting resins and thermoplastic resins can be used to form an adhesive layer, is formed into a film in advance, and then the film thus obtained is used as an adhesive film or a laminate. This makes it possible to produce the "laminated body made up of a graphite sheet and an adhesive layer."

As a method of producing the "plate-shaped material made of merely graphite," a publicly known technique can be used. For example, a general method is a method in which polymeric films, each made of a polyimide resin or the like, are stacked on each other, pressurized, and then heat-treated. By pressurizing and heat-treating the polymeric films in a state where the polymeric films are stacked on each other, the polymeric films are graphitized. This makes it possible to produce a plate-shaped material having a graphite crystal structure.

(Method of Producing Second Thermally Conductive Material)

The second thermally conductive material has a shape of a column thinner than the through hole formed in the first thermally conductive material. Note that the "shape of a column thinner than the through hole" indicates that the diameter of each of the upper surface and the lower surface of the second thermally conductive material is smaller than that of the through hole.

A method of producing the second thermally conductive material is not limited to any particular method. It is possible to produce the second thermally conductive material having a columnar shape, by, for example, (i) a method in which a piece is stamped out from a plate-shaped metal material with use of a punch or the like or (ii) a method in which a piece having a given length is cut from a rod-shaped metal material with use of a wire saw.

(Through Hole Forming Step)

The through hole forming step included in the method of producing the heat transport structure in accordance with an embodiment of the present invention will be described below. The through hole is formed so as to extend in the perpendicular direction of the first thermally conductive material. The through hole is preferably formed in each of the fixing parts of the first thermally conductive material in view of a reduction in weight of an electronic device. A shape of a cross section of the through hole is not limited to any particular shape, but is preferably a circular shape in view of the fitting strength. A method of forming the through hole, having a circular cross section, in the perpendicular direction of the first thermally conductive material is not limited to any particular method. The through hole can be formed by a publicly known method such as drilling, using laser, or punching.

Note that a diameter of the through hole is not limited in particular, but is preferably not less than 0.20 mm and not more than 50.00 mm.

(Inserting Step)

The inserting step included in the method of producing the heat transport structure in accordance with an embodiment of the present invention will be described below. The inserting step is a step of arranging the second thermally conductive material inside the through hole formed in the first thermally conductive material. The second thermally conductive material can be manually arranged inside the through hole with use of a pair of forceps or the like or can be automatically arranged inside the through hole with use of a robot or the like. Note that a preferable state after the inserting step is carried out and right before the fitting step is carried out (see FIGS. 4 and 5) is a state where the second thermally conductive material 2 having a diameter 14 and a thickness 15 is arranged inside the through hole 18 which is formed in the perpendicular direction of the first thermally conductive material 1 and which has a diameter 12 and a thickness 13. The second thermally conductive material 2 is preferably arranged in a central part of the diameter 12 of the through hole 18, in view of excellence in fitting strength in the fitting step (later described).

(Fitting Step)

The fitting step included in a first method of producing the heat transport structure in accordance with an embodiment of the present invention will be described below. The fitting step is a step of compressing the second thermally conductive material, which has been subjected to the inserting step (see FIGS. 4 and 5), in the perpendicular direction so that the second thermally conductive material is expanded and deformed in the surface direction. It is preferable that the first thermally conductive material and the second thermally conductive material be compressed together with use of a compressing jig 11. By compressing the first thermally conductive material and the second thermally conductive material together, the second thermally conductive material is fitted in the through hole in a state where a thickness 13 of the second thermally conductive material 2, which thickness 13 is obtained by carrying out the fitting step, is equal to a thickness 13 of the first thermally conductive material 1, which thickness 13 is obtained by carrying out the fitting step (see FIG. 6). This makes it possible to smoothly transfer heat between the first thermally conductive material 1 and the second thermally conductive material 2. In the fitting step, the second thermally conductive material 2 is preferably fitted in the through hole 18 in a state where the second thermally conductive material 2 slightly expands an inside of the through hole 18 formed in the first thermally conductive material 1, in view of excellence in fitting strength.

The second thermally conductive material 2 which has been subjected to the fitting step is preferably deformed in a state where the side surface of the second thermally conductive material 2 is bulged (see FIG. 6). In this case, the diameter of the part 17 of the second thermally conductive material 2, in which part the side surface of the second thermally conductive material 2 is bulged, is greater than any greater one of the respective diameters of the upper surface 24 and the lower surface 16 of the second thermally conductive material 2. In order that the side surface of the second thermally conductive material 2 is bulged, a volume of the second thermally conductive material 2 which has not been subjected to the fitting step is preferably not less than 80% and not more than 150%, more preferably not less than 100% and not more than 120%, relative to a volume of the through hole 18 formed in the first thermally conductive material 1 (see FIGS. 4 and 5). In a case where the volume of the second thermally conductive material 2 falls within the above preferable range, the side surface of the second thermally conductive material 2 is bulged moderately. This causes the second thermally conductive material 2 to be excellent in fitting strength. Note, however, that, in a case where the volume of the second thermally conductive material 2 which has not been subjected to the fitting step is not less than 80% and less than 100% relative to the volume of the through hole 18 formed in the first thermally conductive material 1, it is possible to compress merely the second thermally conductive material 2 in the perpendicular direction so that the second thermally conductive material 2 is expanded and deformed in the surface direction, by pressing merely the second thermally conductive material 2 in the fitting step with use of a steel plate having a protrusion.

Furthermore, in order that the second thermally conductive material 2 has the part 17 in which the side surface of the second thermally conductive material 2 is bulged (see FIG. 6), respective areas of the upper surface and the lower surface 16 of the second thermally conductive material 2 which has not been subjected to the inserting step are each preferably smaller, by not less than 3%, than that of a cross section of the through hole 18 (for example, respective areas of an upper surface and a lower surface of the through hole) (see FIG. 5). By subjecting such a second thermally conductive material 2 to the inserting step, in which the second thermally conductive material 2 is arranged inside the through hole 18, and the fitting step, the second thermally conductive material 2 is easily caused to have the part 17 in which the side surface of the second thermally conductive material 2 is bulged. This ultimately causes the second thermally conductive material 2 to be excellent in fitting strength. Note that the respective areas of the upper surface 24 and the lower surface 16 of the second thermally conductive material 2 which has not been subjected to the inserting step can be calculated from respective diameters 14 of the upper surface 24 and the lower surface 16 of the second thermally conductive material 2. The area of the through hole 18 can be calculated from the diameter 12 of the through hole 18.

Figure 4:
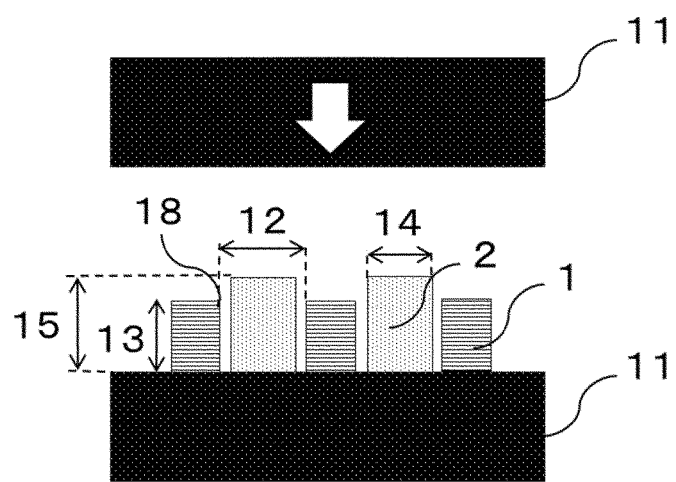
FIG. 4 is a cross-sectional view of the heat transport structure in accordance with an embodiment of the present invention, as viewed from a side of the heat transport structure, and illustrates a preferable embodiment of a fitting step included in a method of producing the heat transport structure.

In order that the second thermally conductive material 2 has the part 17 in which the side surface of the second thermally conductive material 2 is bulged, the thickness 15 of the second thermally conductive material 2 which has not been subjected to the fitting step is preferably greater, by not less than 5%, than the thickness 13 of the through hole 18 (see FIG. 4). By arranging such a second thermally conductive material 2 inside the through hole 18 and subjecting the second thermally conductive material 2 to the fitting step, the second thermally conductive material 2 is easily caused to have the part 17 in which the side surface of the second thermally conductive material 2 is bulged. This ultimately causes the second thermally conductive material 2 to be excellent in fitting strength.

The second thermally conductive material 2 is preferably compressed in the perpendicular direction by pressing. A condition of the pressing is not limited in particular, because the condition of the pressing is set as appropriate depending on kinds, shapes, the number, and the like of the second thermally conductive materials. However, as illustrated in FIG. 4, it is generally preferable to carry out the pressing by using, as the compressing jig 11 for carrying out the pressing, a hydraulic press or the like which includes a steel plate that is harder than the second thermally conductive material 2. Simultaneously with the pressing, the first thermally conductive material 1 and the second thermally conductive material 2 can be heated and be put in a vacuum. In a case where the "laminated body made up of a graphite sheet and an adhesive layer" is used as the first thermally conductive material 1, (i) the adhesive layer which is exposed to the cross section of the through hole 18 is dissolved by heating, and (ii) by keeping the first thermally conductive material 1 and the second thermally conductive material 2 in the vacuum, the first thermally conductive material 1 is caused to suitably adhere, due to the adhesive layer, to the part 17 of the second thermally conductive material 2, in which part the side surface of the second thermally conductive material 2 is bulged. This tends to cause the second thermally conductive material 2 to be more excellent in fitting strength.

EXAMPLES

Some Examples will be shown below for explanation of an embodiment of the present invention. However, the present invention is not limited by such Examples. Properties were evaluated under the following conditions.

[Evaluation Methods]

(Evaluation of Workability)

In a process of producing a heat transport structure, a second thermally conductive material was manually inserted, with use of a pair of forceps, into a through hole formed in a first thermally conductive material. In a case where the second thermally conductive material could be inserted into the through hole by smooth operation without any problem, workability was evaluated as "A." In a case where the second thermally conductive material was forcibly inserted into the through hole with time, the workability was evaluated as being poor and as "B." In a case where the second thermally conductive material could not be inserted into the through hole and, accordingly, the heat transport structure could not be produced, the workability was evaluated as being poor and as "C."

(Evaluation of Fitting Strength and Shape of Second Thermally Conductive Material)

A produced heat transport structure was in whole fixed, and a load was imposed on a central part, in a surface direction, of the second thermally conductive material at a rate of 1 mm/min. A value of the load at a time when the second thermally conductive material fell off the first thermally conductive material was measured with use of a force gauge DS2-2N manufactured by AMADA Co., Ltd. The value of the load was divided by a value of any longer one of respective circumferences of an upper surface and a lower surface of the second thermally conductive material which had fallen, and a value thus obtained was rounded off to two decimal places. The value thus obtained was evaluated as fitting strength per unit circumference of the through hole. In a case where the fitting strength was not less than 1.00 N/mm, the fitting strength was evaluated as "A." In a case where the fitting strength was not less than 0.50 N/mm and less than 1.00 N/mm, the fitting strength was evaluated as "B." In a case where the fitting strength was not less than 0.30 N/mm and less than 0.50 N/mm, the fitting strength was evaluated as "C." In a case where the fitting strength was less than 0.30 N/mm, the fitting strength was evaluated as "D." It was determined that the fitting strength evaluated as "A" or "B" was excellent fitting strength.

Respective diameters of the upper surface and the lower surface of the second thermally conductive material which had fallen were measured with use of a vernier caliper. Furthermore, a diameter of part of the second thermally conductive material in which part a side surface of the second thermally conductive material was most bulged was measured with use of the vernier caliper. In a case where (i) the diameter of the part in which the side surface was most bulged was greater, by not less than 0.3 mm, than the respective diameters of the upper surface and the lower surface and (ii) the side surface was apparently bulged, a shape of the second thermally conductive material was evaluated as "A." In a case where (i) the diameter of the part in which the side surface was most bulged was greater, by not less than 0.1 mm and less than 0.3 mm, than the respective diameters of the upper surface and the lower surface and (ii) the side surface was apparently bulged, the shape of the second thermally conductive material was evaluated as "B." In a case where (i) the diameter of the part in which the side surface was most bulged was greater, by less than 0.1 mm, than the respective diameters of the upper surface and the lower surface and (ii) the side surface was hardly bulged, the shape of the second thermally conductive material was evaluated as "C."

(Evaluation of Heat Transfer Efficiency)

A heat transport structure 5 illustrated in FIGS. 1 and 2 was used. As illustrated in FIG. 3, a micro ceramic heater MS-3, which was manufactured by Sakaguchi E. H VOC Corp. and which served as a heater 6, was disposed on one of fixing parts 4 of the heat transport structure 5 via a λ GEL sheet COH-4000LVC, which was manufactured by Taica Corporation and which served as a thermally conductive adhesive 7. The other one of the fixing parts 4 was cooled with water of 18° C. in a water bath 8. The heater 6 was caused to generate heat, by applying electric power of 2 W to the heater 6. The heater 6 was then caused to stand in this state for 30 minutes. Respective temperatures of temperature sensing parts 9 and 10 which were located at respective both ends of a heat transfer part 3 were measured with use of a thermocouple. A length of the heat transfer part 3 and an area of a cross section of the heat transfer part 3 had been measured in advance. Then, those measured values were substituted into an expression (2), and a value thus obtained was rounded off to two decimal places. A thermal conductivity ($\lambda 2$) which the heat transfer part 3 exhibited in the surface direction was thus calculated.

Heat transfer efficiency ($\lambda 2/\lambda 1$) was calculated from (i) a thermal conductivity ($\lambda 1$) which the heat transfer part exhibited in the surface direction and which was derived with use of a light alternating-current method and (ii) the thermal conductivity ($\lambda 2$) which the heat transfer part exhibited in the surface direction and which was derived from temperature distribution of the heat transfer part which temperature distribution was measured in a case where the heat was inputted in the one of the fixing parts. In a case where the heat transfer efficiency ($\lambda 2/\lambda 1$) was not less than 0.70, the heat transfer efficiency ($\lambda 2/\lambda 1$) was evaluated as "A." In a case where the heat transfer efficiency ($\lambda 2/\lambda 1$) was not less than 0.60 and less than 0.70, the heat transfer efficiency ($\lambda 2/\lambda 1$) was evaluated as "B." In a case where the heat transfer efficiency ($\lambda 2/\lambda 1$) was not less than 0.30 and less than 0.60, the heat transfer efficiency ($\lambda 2/\lambda 1$) was evaluated as "C." In a case where the heat transfer efficiency ($\lambda 2/\lambda 1$) was less than 0.30, the heat transfer efficiency ($\lambda 2/\lambda 1$) was evaluated as "D." It was determined that the heat transfer efficiency evaluated as "A" or "B" was excellent heat transfer efficiency.

(Evaluation of Heat Transfer Density)

A heat transfer density ($\lambda 2/D$) was calculated from (i) the thermal conductivity ($\lambda 2$) which the heat transfer part 3 exhibited in the surface direction and which was derived from the temperature distribution of the heat transfer part which temperature distribution was measured in a case where the heat was inputted in the one of the fixing parts (see FIG. 3) and (ii) a density (D) of the heat transfer part 3. The density (D) of the heat transfer part was determined by (i) measuring a weight and a thickness of a sample, measuring 100 mm×100 mm, of the first thermally conductive material, (ii) dividing a value of the weight by a value of a volume, and (iii) rounding off a value thus obtained to two decimal places. In a case where the heat transfer density ($\lambda 2/D$) was not less than 0.57 Wm$^2$/K·kg, the heat transfer density ($\lambda 2/D$) was evaluated as "A." In a case where the heat transfer density ($\lambda 2/D$) was not less than 0.50 Wm$^2$/K·kg and less than 0.57 Wm$^2$/K·kg, the heat transfer density ($\lambda 2/D$) was evaluated as "B." In a case where the heat transfer density ($\lambda 2/D$) was not less than 0.30 Wm$^2$/K·kg and less than 0.50 Wm$^2$/K·kg, the heat transfer density ($\lambda 2/D$) was evaluated as "C." In a case where the heat transfer density ($\lambda 2/D$) was less than 0.30 Wm$^2$/K·kg, the heat transfer density ($\lambda 2/D$) was evaluated as "D." It was determined that the heat transfer density evaluated as "A" or "B" was an excellent heat transfer density.

Comparative Example 1

Graphite sheets each manufactured by Kaneka Corporation were used. Each of the graphite sheets had (i) a thickness of 40 μm, (ii) a thermal conductivity ($\lambda 1$) of 1,350 W/m·K in a surface direction of a heat transfer part, the thermal conductivity ($\lambda 1$) being derived with use of a light alternating-current method, and (iii) a thermal conductivity of 5 W/m·K in a perpendicular direction of the heat transfer part. An acrylic adhesive G-2S manufactured by Jujo Chemical Co., Ltd. was applied to one of surfaces of each of 11 graphite sheets so that the acrylic adhesive would have a thickness of 10 μm after being dried. The 11 graphite sheets thus obtained were stacked on each other, and a graphite sheet to which no adhesive was applied was placed on a top of the 11 graphite sheets. Those graphite sheets were caused to adhere to each other, by hot pressing. The hot pressing was carried out for 10 minutes under a pressure of 0.5 MPa at a temperature of 100° C. The graphite sheets thus obtained were cut so that a cut piece had a width of 30 mm and a length of 200 mm. In this manner, a first thermally conductive material 1 having a thickness of 600 μm was obtained. Note that regions which were located at respective both ends of the first thermally conductive material 1 and which each had a width of 30 mm and a length of 20 mm were virtually regarded as fixing parts, and the other part of the first thermally conductive material 1 was regarded as a heat transfer part. Thereafter, a thermal conductivity ($\lambda 2$), which the heat transfer part 3 exhibited in a surface direction and which was derived from temperature distribution of the heat transfer part which temperature distribution was measured in a case where heat was inputted in one of the fixing parts, was evaluated.

Comparative Example 2

As in Comparative Example 1, (i) an acrylic adhesive G-2S manufactured by Jujo Chemical Co., Ltd. was applied to each of 35 graphite sheets each of which was manufactured by Kaneka Corporation and each of which had a thickness of 40 µm, (ii) the 35 graphite sheets thus obtained were stacked on each other, and then (iii) a graphite sheet to which no adhesive was applied was placed on a top of the 35 graphite sheets, so as to obtain a first thermally conductive material 1 having a thickness 1,800 µm. Note that regions which were located at respective both ends of the first thermally conductive material 1 and which each had a width of 30 mm and a length of 20 mm were virtually regarded as fixing parts, and the other part of the first thermally conductive material 1 was regarded as a heat transfer part. Thereafter, a thermal conductivity (λ2), which the heat transfer part 3 exhibited in a surface direction and which was derived from temperature distribution of the heat transfer part which temperature distribution was measured in a case where heat was inputted in one of the fixing parts, was evaluated.

Example 1

A heat transport structure 5 illustrated in FIGS. 1 and 2 was produced by carrying out a fitting step illustrated in FIGS. 4 and 5. Specifically, four through holes 18 each having a diameter 12 of 5 mm were formed, with use of a punch, in each of the regions which were located at the respective both ends of the first thermally conductive material 1 obtained in Comparative Example 1 and which each had a width of 30 mm and a length of 20 mm. In total, eight through holes 18 were formed. Surface roughness Rz of an inner surface of each of the through holes formed in the first thermally conductive material 1 was not less than 3.5 µm and not more than 200 µm. The through holes 18 in each of the regions were arranged such that (i) a distance between respective centers of most adjacent ones of the through holes 18 was 10 mm and (ii) the through holes 18 formed a square pattern. Second thermally conductive materials 2 each of which was made of copper and each of which had a diameter 14 of 4.9 mm and a thickness 15 of 700 µm were arranged in the respective through holes 18 with use of a pair of forceps. FIG. 5 illustrates such a state. The first thermally conductive material 1 and the second thermally conductive materials 2 were in whole pressed with use of a hydraulic press which served as a compressing jig 11. The second thermally conductive materials 2 were thus compressed until each of the second thermally conductive materials 2 had a thickness identical to that of the first thermally conductive material 1. As a result, a heat transport structure 5 was obtained which had a heat transfer part 3 and two fixing parts 4 (each having a width of 30 mm and a length of 20 mm) and which had a thickness 13 of 600 µm.

Example 2

A heat transport structure 5 illustrated in FIGS. 1 and 2 was produced by carrying out a fitting step illustrated in FIGS. 4 and 5. Specifically, a heat transport structure 5 which had a heat transfer part 3 and two fixing parts 4 (each having a width of 30 mm and a length of 20 mm) and which had a thickness 13 of 1,800 µm was obtained as in Example 1, except that (i) the first thermally conductive material 1 obtained in Comparative Example 2 was used and (ii) second thermally conductive materials 2 each of which had a thickness 15 of 2,000 µm were used.

TABLE 1

| | First thermally conductive material | | Through hole | | Second thermally conductive material | | | | Fitting strength | | |
|---|---|---|---|---|---|---|---|---|---|---|---|
| | Material | Density kg/m³ | Diameter mm | Height µm | Material | Diameter mm | Height mm | Workability | N/mm | Evaluation | Shape |
| Example 1 | GS + Resin | 1800 | 5.00 | 600 | Cu | 4.90 | 700 | A | 1.12 | A | A |
| Example 2 | GS + Resin | 1800 | 5.00 | 1800 | Cu | 4.90 | 2000 | A | 1.50 | A | A |
| Comparative Example 1 | GS + Resin | 1800 | 5.00 | 600 | | | | Not used | | | |
| Comparative Example 2 | GS + Resin | 1800 | 5.00 | 1800 | | | | Not used | | | |

| | Thermal conductivity | | Heat transfer efficiency | | Heat transfer density | |
|---|---|---|---|---|---|---|
| | λ1 | λ2 | λ2/λ1 | | λ2/D | |
| | W/mK | W/mK | Value | Evaluation | Value | Evaluation |
| Example 1 | 1350 | 1060 | 0.78 | A | 0.58 | A |
| Example 2 | 1350 | 990 | 0.73 | A | 0.55 | B |
| Comparative Example 1 | 1350 | 783 | 0.58 | C | 0.44 | C |
| Comparative Example 2 | 1350 | 351 | 0.26 | D | 0.19 | D |

Heat transfer efficiency and a heat transfer density in each of Examples 1 and 2, in each of which the second thermally conductive materials 2 were used, were excellent, as compared with those in each of Comparative Examples 1 and 2.

Example 3

A heat transport structure 5 illustrated in FIGS. 1 and 2 was produced by carrying out a fitting step illustrated in FIGS. 4 and 5. Graphite sheets each manufactured by Kaneka Corporation were used. Each of the graphite sheets had (i) a thickness of 40 μm, (ii) a thermal conductivity (λ1) of 1,350 W/m·K in a surface direction of a heat transfer part, the thermal conductivity (λ1) being derived with use of a light alternating-current method, and (iii) a thermal conductivity of 5 W/m·K in a perpendicular direction of the heat transfer part. Each of the graphite sheets was cut so that a cut piece had a width of 30 mm and a length of 200 mm. An acrylic adhesive G-2S manufactured by Jujo Chemical Co., Ltd. was applied to regions, which were located at respective both ends of a first thermally conductive material 1 and which each had a width of 30 mm and a length of 20 mm, so that the acrylic adhesive would have a thickness of 10 μm after being dried. Then, 11 graphite sheets thus obtained were stacked on each other, and a graphite sheet to which no adhesive was applied was placed on a top of the 11 graphite sheets. Those graphite sheets were caused to adhere to each other, by hot pressing. The hot pressing was carried out for 10 minutes under a pressure of 0.5 MPa at a temperature of 100° C. A first thermally conductive material 1 having a thickness 13 of 600 μm was thus obtained.

Next, as in Example 1, a heat transport structure 5 was obtained which had a thickness 13 of 600 μm and which had (i) a heat transfer part 3 in which the graphite sheets were caused not to adhere to each other and (ii) two fixing parts 4 (each having a width of 30 mm and a length of 20 mm).

Example 4

A heat transport structure 5 illustrated in FIGS. 1 and 2 was produced by carrying out a fitting step illustrated in FIGS. 4 and 5. A heat transport structure 5 which had a heat transfer part 3 and two fixing parts 4 (each having a width of 30 mm and a length of 20 mm) and which had a thickness 13 of 600 μm was obtained as in Example 1, except that second thermally conductive materials 2 each of which was made of aluminum were used.

Example 5

A heat transport structure 5 illustrated in FIGS. 1 and 2 was produced by carrying out a fitting step illustrated in FIGS. 4 and 5. An acrylic adhesive G-2S manufactured by Jujo Chemical Co., Ltd. was applied to each of graphite sheets so that the acrylic adhesive would have a thickness of 20 μm after being dried.

Then, two graphite sheets thus obtained were stacked on each other, and caused to adhere to each other by hot pressing. The hot pressing was carried out for 10 minutes under a pressure of 0.5 MPa at a temperature of 100° C. The graphite sheets thus obtained were cut so that a cut piece had a width of 30 mm and a length of 200 mm. A first thermally conductive material 1 having a thickness 13 of 100 μm was thus obtained.

Next, a heat transport structure 5 which had a heat transfer part 3 and two fixing parts 4 (each having a width of 30 mm and a length of 20 mm) and which had a thickness 13 of 100 μm was obtained as in Example 1, except that second thermally conductive materials 2 each of which had a thickness 15 of 120 μm were used.

Example 6

A first heat transport structure 1 was obtained as in Comparative Example 1, except that the first heat transport structure 1 was caused to have a width of 60 mm and a length of 200 m.

Next, one (1) through hole 18 having a diameter 12 of 50 mmφ was formed, with use of a punch, in a center of each of regions which were located at respective both ends of the first thermally conductive material 1 and which each had a width of 60 mm and a length of 60 mm. In total, two through holes 18 were formed. Second thermally conductive materials 2 each of which was made of copper and each of which had a diameter 14 of 49 mmφ and a thickness 15 of 800 μm were arranged in the respective through holes 18. The first thermally conductive material 1 and the second thermally conductive materials 2 were in whole pressed with use of a hydraulic press which served as a compressing jig 11. The second thermally conductive materials 2 were thus compressed until each of the second thermally conductive materials 2 had a thickness identical to that of the first thermally conductive material 1. As a result, a heat transport structure 5 was obtained which had a heat transfer part 3 and two fixing parts 4 (each having a width of 60 mm and a length of 60 mm) and which had a thickness 13 of 600 μm.

Example 7

A first thermally conductive material 1 was obtained as in Comparative Example 2, except that (i) the first thermally conductive material 1 was caused to have a width of 10 mm and a length of 100 m and (ii) the first thermally conductive material 1 was caused to have a thickness 13 of 200 μm by (a) applying an acrylic adhesive G-2S, manufactured by Jujo Chemical Co., Ltd., to each of four graphite sheets, each manufactured by Kaneka Corporation, and (b) stacking the four graphite sheets thus obtained on each other.

Next, nine through holes 18 each having a diameter 12 of 0.2 mmφ were uniformly formed, with use of a drill, in each of regions which were located at respective both ends of the first thermally conductive material 1 and which each had a width of 10 mm and a length of 10 mm. In total, 18 through holes 18 were formed. The through holes 18 in each of the regions were arranged such that (i) a distance between respective centers of most adjacent ones of the through holes 18 was 2 mm and (ii) the through holes 18 formed a 3×3 quadrangular grid pattern. Second thermally conductive materials 2 each of which was made of copper and each of which had a diameter 14 of 0.18 mmφ and a thickness 15 of 210 μm were arranged in the respective through holes 18. The first thermally conductive material 1 and the second thermally conductive materials 2 were in whole pressed with use of a hydraulic press which served as a compressing jig 11. The second thermally conductive materials 2 were thus compressed until each of the second thermally conductive materials 2 had a thickness identical to that of the first thermally conductive material 1. As a result, a heat transport structure 5 was obtained which had a heat transfer part 3 and two fixing parts 4 (each having a width of 10 mm and a length of 10 mm) and which had a thickness 13 of 200 μm. Since the diameter 14 of each of the second thermally conductive materials and the diameter 12 of each of the through holes were smaller, workability was rather poor.

Example 8

A heat transport structure 5 illustrated in FIGS. 1 and 2 was produced by carrying out a fitting step illustrated in FIGS. 4 and 5. Polyimide films (25AH) each manufactured by Kaneka Corporation were stacked on each other, and preheated to 1,000° C. in an inert gas under increased pressure so as to be carbonated. A carbonated film thus obtained was then heat-treated to 2,800° C. in an inert gas atmosphere under increased pressured so as to be graphitized. In this way, a plate-shaped material made of merely graphite was obtained. The plate-shaped material was abraded so as to have a width of 30 mm, a length of 200 mm, and a thickness of 600 μm. A first thermally conductive material 1 was thus obtained which had (i) a thermal conductivity (λ1) of 1,500 W/m·K in a surface direction of a heat transfer part, the thermal conductivity (λ1) being derived with use of a light alternating-current method, and (ii) a thermal conductivity of 5 W/m·K in a perpendicular direction of the heat transfer part.

Next, as in Example 1, a heat transport structure 5 was obtained which had a heat transfer part 3 and two fixing parts 4 (each having a width of 30 mm and a length of 20 mm) and which had a thickness 13 of 600 μm.

Example 9

A heat transport structure 5 illustrated in FIGS. 1 and 2 was produced by carrying out a fitting step illustrated in FIGS. 4 and 5. A heat transport structure 5 which had a heat transfer part 3 and two fixing parts 4 (each having a width of 30 mm and a length of 20 mm) and which had a thickness 13 of 5 mm was obtained as in Example 8, except that (i) a first thermally conductive material 1 was caused to have a thickness 13 of 5 mm and (ii) second thermally conductive materials each of which had a thickness 15 of 5.5 mm were used.

Example 10

A heat transport structure 5 illustrated in FIGS. 1 and 2 was produced by carrying out a fitting step illustrated in FIGS. 4 and 5. Natural graphite sheets (manufactured by Toyo Tanso Co., Ltd.) were used. Each of the natural graphite sheets had (i) a thickness of 80 μm, (ii) a thermal conductivity (λ1) of 200 W/m·K in a surface direction of a heat transfer part, the thermal conductivity (λ1) being derived with use of a light alternating-current method, and (iii) a thermal conductivity of 5 W/m·K in a perpendicular direction of the heat transfer part. An acrylic adhesive G-2S manufactured by Jujo Chemical Co., Ltd. was applied to one of surfaces of each of six natural graphite sheets so that the acrylic adhesive would have a thickness of 8 μm after being dried. The six natural graphite sheets thus obtained were stacked on each other, and a natural graphite sheet to which no adhesive was applied was placed on a top of the six natural graphite sheets. Those natural graphite sheets were caused to adhere to each other, by hot pressing. The hot pressing was carried out for 10 minutes under a pressure of 0.5 MPa at a temperature of 100° C. The natural graphite sheets thus obtained were cut so that a cut piece had a width of 30 mm and a length of 200 mm. In this manner, a first thermally conductive material 1 having a thickness 13 of 600 μm was obtained.

Next, as in Example 1, a heat transport structure 5 was obtained which had a heat transfer part 3 and two fixing parts 4 (each having a width of 30 mm and a length of 20 mm) and which had a thickness 13 of 600 μm.

Example 11

A heat transport structure 5 illustrated in FIGS. 1 and 2 was produced by carrying out a fitting step illustrated in FIGS. 4 and 5. A heat transport structure 5 which had a heat transfer part 3 and two fixing parts 4 (each having a width of 30 mm and a length of 20 mm) and which had a thickness 13 of 600 μm was obtained as in Example 1, except that second thermally conductive materials 2 each of which was made of copper and each of which had a diameter 14 of 4.97 mmφ and a thickness 15 of 620 μm were used.

Example 12

A heat transport structure 5 illustrated in FIGS. 1 and 2 was produced by carrying out a fitting step illustrated in FIGS. 4 and 5. Polyimide films (75AH) each manufactured by Kaneka Corporation were preheated to 1,000° C. in an inert gas so as to be carbonated. Carbonated films thus obtained were heat-treated to 2,800° C. in an inert gas atmosphere under increased pressure so as to be graphitized. In this way, graphite sheets were obtained each of which had (i) a thickness of 110 μm, (ii) a thermal conductivity (λ1) of 500 W/m·K in a surface direction of a heat transfer part, the thermal conductivity (λ1) being derived with use of a light alternating-current method, and (iii) a thermal conductivity of 1 W/m·K in a perpendicular direction of the heat transfer part. An acrylic adhesive G-2S manufactured by Jujo Chemical Co., Ltd. was applied to one of surfaces of each of four graphite sheets so that the acrylic adhesive would have a thickness of 12.5 μm after being dried. The four graphite sheets thus obtained were stacked on each other, and a graphite sheet to which no adhesive was applied was placed on a top of the four graphite sheets. Those graphite sheets were caused to adhere to each other, by hot pressing. The hot pressing was carried out for 10 minutes under a pressure of 0.1 MPa at a temperature of 100° C. The graphite sheets thus obtained were cut so that a cut piece had a width of 30 mm and a length of 200 mm. In this manner, a first thermally conductive material 1 having a thickness 13 of 600 μm was obtained.

Next, as in Example 1, a heat transport structure 5 was obtained which had a heat transfer part 3 and two fixing parts 4 (each having a width of 30 mm and a length of 20 mm) and which had a thickness 13 of 600 μm.

Comparative Example 3

A produced heat transport structure 5 is illustrated in FIGS. 1 and 2. A first thermally conductive material 1 was obtained as in Example 10. Four through holes 18 each having a diameter 12 of 5 mmφ were uniformly formed, with use of a punch, in each of regions which were located at respective both ends of the first thermally conductive material 1 and which each had a width of 30 mm and a length of 20 mm. In total, eight through holes 18 were formed. The through holes 18 in each of the regions were arranged such that (i) a distance between respective centers of most adjacent ones of the through holes 18 was 10 mm and (ii) the through holes 18 formed a square pattern. Second thermally conductive materials 2 each of which was made of copper and each of which had a diameter 14 of 5.5 mmφ and a thickness 15 of 600 μm were press-fitted into the respective through holes 18, so that a heat transport structure 5 was obtained which had a heat transfer part 3 and two fixing parts 4 (each having a width of 30 mm and a length of 20 mm) and which had a thickness 13 of 600 μm. Since the diameter 14 of each of the second thermally conductive materials was larger than the diameter 12 of a corresponding one of the through holes 18, it was necessary to forcibly insert the second thermally conductive materials into the respective through holes 18. This caused, for example, the first thermally conductive material 1 to be deformed. That is, workability was rather poor.

Comparative Example 4

A heat transport structure 5 illustrated in FIGS. 1 and 2 was produced by carrying out a fitting step illustrated in FIGS. 4 and 5. A heat transport structure 5 which had a heat transfer part 3 and two fixing parts 4 (each having a width of 30 mm and a length of 20 mm) and which had a thickness 13 of 600 μm was obtained as in Example 1, except that second thermally conductive materials 2 each of which had a diameter 14 of 4.0 mmφ and a thickness 15 of 700 μm were used.

Comparative Example 5

Operations were conducted as in Example 7, except that (i) through holes 18 each of which had a diameter 12 of 0.1 mmφ were formed in a first thermally conductive material and (ii) second thermally conductive materials 2 each of which had a diameter 14 of 0.9 mmφ were used. Workability was extremely poor, and it was difficult to handle the second thermally conductive materials and to carry out an inserting step. Ultimately, it was not possible to obtain a heat transport structure 5.

Comparative Example 6

Operations were conducted as in Example 1, except that second thermally conductive materials 2 each of which had a diameter 14 of 7.0 mmφ and a thickness 15 of 600 μm were used. When it was intended that the second thermally conductive materials 2 be inserted in respective through holes 18 by press-fitting the second thermally conductive materials 2 into the respective through holes 18, a first thermally conductive material 1 in which the through holes 18 were formed was partially broken. That is, workability was extremely poor, and it was not possible to obtain a heat transport structure 5.

TABLE 2

| | First thermally conductive material | | Through hole | | Second thermally conductive material Before fitting step | | | | Fitting strength | | |
|---|---|---|---|---|---|---|---|---|---|---|---|
| | Material | Density kg/m³ | Diameter mm | Height μm | Material | Diameter mm | Height mm | Workability | N/mm | Evaluation | Shape |
| Example 1 | GS + Resin | 1800 | 5.00 | 600 | Cu | 4.90 | 700 | A | 1.12 | A | A |
| Example 2 | GS + Resin | 1800 | 5.00 | 1800 | Cu | 4.90 | 2000 | A | 1.50 | A | A |
| Example 3 | GS + Resin | 1800 | 5.00 | 600 | Cu | 4.90 | 700 | A | 1.12 | A | A |
| Example 4 | GS + Resin | 1800 | 5.00 | 600 | Al | 4.90 | 700 | A | 1.08 | A | A |
| Example 5 | GS + Resin | 1800 | 5.00 | 100 | Cu | 4.90 | 120 | A | 0.56 | B | B |
| Example 6 | GS + Resin | 1800 | 50.00 | 600 | Cu | 49.00 | 800 | A | 0.50 | B | A |
| Example 7 | GS + Resin | 1800 | 0.20 | 200 | Cu | 0.18 | 210 | B | 0.64 | B | B |
| Example 8 | Only GS | 2000 | 5.00 | 600 | Cu | 4.90 | 700 | A | 0.81 | B | B |
| Example 9 | Only GS | 2000 | 5.00 | 5000 | Cu | 4.90 | 5500 | A | 0.94 | B | B |
| Example 10 | GS + Resin | 1000 | 5.00 | 600 | Cu | 4.90 | 700 | A | 0.50 | B | A |
| Example 11 | GS + Resin | 1800 | 5.00 | 600 | Cu | 4.97 | 620 | A | 0.57 | B | C |
| Example 12 | GS + Resin | 600 | 5.00 | 600 | Cu | 4.90 | 700 | A | 0.94 | B | A |
| Comparative Example 3 | GS + Resin | 1000 | 5.00 | 600 | Cu | 5.50 | 600 | B | 0.35 | C | C |
| Comparative Example 4 | GS + Resin | 1800 | 5.00 | 600 | Cu | 4.00 | 700 | A | 0.13 | D | A |
| Comparative Example 5 | GS + Resin | 1800 | 0.10 | 200 | Cu | 0.09 | 210 | C | Could not be produced | | |
| Comparative Example 6 | GS + Resin | 1800 | 5.00 | 600 | Cu | 7.00 | 700 | C | Could not be produced | | |

| | Thermal conductivity | | Heat transfer efficiency | | Heat transfer density | |
|---|---|---|---|---|---|---|
| | $\lambda 1$ W/mK | $\lambda 2$ W/mK | $\lambda 2/\lambda 1$ Value | Evaluation | $\lambda 2/D$ Value | Evaluation |
| Example 1 | 1350 | 1060 | 0.78 | A | 0.58 | A |
| Example 2 | 1350 | 990 | 0.73 | A | 0.55 | B |
| Example 3 | 1350 | 1050 | 0.78 | A | 0.58 | A |
| Example 4 | 1350 | 1030 | 0.76 | A | 0.57 | A |
| Example 5 | 1350 | 1200 | 0.89 | A | 0.67 | A |
| Example 6 | 1350 | 930 | 0.69 | B | 0.56 | B |
| Example 7 | 1350 | 1120 | 0.83 | A | 0.62 | A |
| Example 8 | 1500 | 1160 | 0.77 | A | 0.58 | A |
| Example 9 | 1500 | 1140 | 0.76 | A | 0.57 | A |
| Example 10 | 200 | 130 | 0.65 | B | 0.13 | D |

TABLE 2-continued

| | | | | | | | |
|---|---|---|---|---|---|---|---|
| Example 11 | 1500 | 900 | 0.60 | B | 0.50 | B |
| Example 12 | 500 | 400 | 0.80 | A | 0.67 | A |
| Comparative Example 3 | 200 | 110 | 0.55 | C | 0.11 | D |
| Comparative Example 4 | 1350 | 800 | 0.59 | C | 0.44 | C |
| Comparative Example 5 | Could not be produced | | | | | |
| Comparative Example 6 | Could not be produced | | | | | |

The fitting strength in each of Examples 1 through 12 was excellent, as compared with that in each of Comparative Examples 3 and 4. In each of Comparative Examples 5 and 6, it was not possible to produce a heat transport structure. In Comparative Example 3, in which the fitting strength was poor, since the second thermally conductive materials 2, each of which had a diameter 14 that was greater than the diameter 12 of a corresponding one of the through holes 18, were press-fitted into the respective through holes 18 without being compressed, the side surface of each of the second thermally conductive materials 2 was not bulged. As a result, in Comparative Example 3, the heat transfer density was poor, and also the heat transfer efficiency was poor. In Comparative Example 4, in which the fitting strength was poor, each of the second thermally conductive materials had a volume that was less than 80% of the volume of a corresponding one of the through holes 18. It is considered that, for that reason, each of the second thermally conductive materials was not sufficiently held by the inner surface of a corresponding one of the through holes 18. As a result, in Comparative Example 4, the heat transfer density was poor, and also the heat transfer efficiency was poor.

The first thermally conductive materials 1 in Examples 1, 2, and 5 had respective different thicknesses 13. However, since the thickness 13 of the first thermally conductive material 1 in each of Examples 1, 2, and 5 fell within a preferable range, the fitting strength in each of Examples 1, 2, and 5 was excellent, as compared with that in each of Comparative Examples 3 and 4. Furthermore, in each of Examples 1, 2, and 5, the heat transfer efficiency and the heat transfer density were also excellent.

The fitting strength in Example 3, in which, unlike Example 1, the graphite sheets in the heat transfer part 3 were caused not to adhere to each other, and the fitting strength in Example 4, in which, unlike Example 1, each of the second thermally conductive materials 2 was made of aluminum instead of copper, were excellent, as compared with that in each of Comparative Examples 3 and 4. Furthermore, in each of Examples 3 and 4, the heat transfer efficiency and the heat transfer density were also excellent.

In each of Examples 6 and 7, the diameter 12 of each of the through holes 18 was changed from that in Example 1. However, since the diameter 12 of each of the through holes 18 fell within a preferable range, the fitting strength in each of Examples 6 and 7 was excellent, as compared with that in each of Comparative Examples 3 and 4. Furthermore, in each of Examples 6 and 7, the heat transfer efficiency and the heat transfer density were also excellent.

The through holes 18 in Example 7 were smaller than those in Example 1. However, since the diameter of each of the through holes fell within the preferable range, the fitting strength in Example 7 was excellent, as compared with that in each of Comparative Examples 3 and 4. Furthermore, in Example 7, the heat transfer efficiency and the heat transfer density were also excellent.

The fitting strength in each of Examples 8 and 9, in each of which the first thermally conductive material 1 was constituted by merely graphite, was excellent, as compared with that in each of Comparative Examples 3 and 4. Furthermore, in each of Examples 8 and 9, the heat transfer efficiency and the heat transfer density were also excellent.

In each of Examples 10 and 12, the thermal conductivity, in the surface direction, of the first thermally conductive material 1 was changed from that in Example 1. However, since the thermal conductivity, in the surface direction, of the first thermally conductive material 1 fell within a preferable range, the fitting strength in each of Examples 10 and 12 was excellent, as compared with that in each of Comparative Examples 3 and 4.

In Example 11, the shape of each of the second thermally conductive materials 2 was changed from that in Example 1. However, since the volume of each of the second thermally conductive materials 2 fell within a preferable range relative to the volume of a corresponding one of the through holes 18, the fitting strength in Example 11 was excellent, as compared with that in each of Comparative Examples 3 and 4. Furthermore, in Example 11, the heat transfer efficiency and the heat transfer density were also excellent.

It is clear from Examples 1 through 12 that the present invention is excellent in fitting strength and, due to this fact, the present invention realizes smooth transfer of heat between the first thermally conductive material and the second thermally conductive materials and has excellent heat transfer efficiency. Furthermore, the present invention is excellent in heat transfer density and, accordingly, allows heat to be transferred with a high density. It is therefore possible to contribute to densification of an electronic device.

INDUSTRIAL APPLICABILITY

The present invention can be suitably used in an electronic device.

REFERENCE SIGNS LIST

1. First thermally conductive material
2. Second thermally conductive material
3. Heat transfer part
4. Fixing part
5. Heat transport structure
6. Heater
7. Thermally conductive adhesive
8. Water bath
9. Temperature sensing part
10. Temperature sensing part
11. Compressing jig
12. Diameter
13. Thickness
14. Diameter 15. Thickness
16. Lower surface
17. Part in which a side surface is bulged
18. Through hole
19. Surface direction
20. Perpendicular direction
21. Central part
22. Length
23. Width
24. Upper surface

The invention claimed is:

1. A heat transport structure comprising:
a first thermally conductive material in which through holes are formed; and
second thermally conductive materials which are fitted in the respective through holes,
a thermal conductivity which the first thermally conductive material exhibits in a surface direction of the first thermally conductive material being higher than a thermal conductivity which the first thermally conductive material exhibits in a perpendicular direction of the first thermally conductive material, the perpendicular direction being a direction perpendicular to the surface direction,
each of the through holes being formed so as to penetrate the first thermally conductive material in the perpendicular direction of the first thermally conductive material,
each of the second thermally conductive materials being held by an inner surface of a corresponding one of the through holes, and having fitting strength of not less than 0.5 N/mm per unit circumference of the corresponding one of the through holes,
a thermal conductivity which each of the second thermally conductive materials exhibits in the perpendicular direction of the first thermally conductive material being higher than the thermal conductivity which the first thermally conductive material exhibits in the perpendicular direction of the first thermally conductive material.

2. The heat transport structure as set forth in claim 1, wherein each of the second thermally conductive materials has a shape of a column having a bulged side surface.

3. The heat transport structure as set forth in claim 1, comprising:
a plurality of fixing parts in which the second thermally conductive materials are held; and
a heat transfer part which is located between the plurality of fixing parts.

4. The heat transport structure as set forth in claim 3, wherein:
the first thermally conductive material contains graphite;
a thermal conductivity ($\lambda1$) which the heat transfer part exhibits in the surface direction and is not less than 500 W/m·K, wherein the thermal conductivity ($\lambda1$) is derived using a light alternating-current method; and
a thermal conductivity which the heat transfer part exhibits in the perpendicular direction is not more than 25 W/m·K, wherein the thermal conductivity is derived using a frequency-charging method.

5. The heat transport structure as set forth in claim 3, wherein:
heat transfer efficiency ($\lambda2/\lambda1$) is not less than 0.60, the heat transfer efficiency ($\lambda2/\lambda1$) being calculated from (i) a thermal conductivity ($\lambda1$) which the heat transfer part exhibits in the surface direction, wherein the thermal conductivity ($\lambda1$) and which is derived using a light alternating-current method and (ii) a thermal conductivity ($\lambda2$) which the heat transfer part exhibits in the surface direction, wherein the thermal conductivity ($\lambda2$) is derived from temperatures of the heat transfer part wherein the temperatures are measured when heat is inputted in one of the plurality of fixing parts; and
a thickness of the heat transfer part is not less than 100 µm.

6. The heat transport structure as set forth in claim 3, wherein a heat transfer density ($\lambda2/D$) is not less than 0.50 W·m$^2$/K·kg, the heat transfer density ($\lambda2/D$) being calculated from (i) a thermal conductivity ($\lambda2$) which the heat transfer part exhibits in the surface direction wherein the thermal conductivity ($\lambda2$) is derived from a temperature distribution of the heat transfer part, wherein the temperature distribution is measured when heat is inputted in one of the plurality of fixing parts and (ii) a density (D) of the heat transfer part.

7. The heat transport structure as set forth in claim 1, wherein a diameter of each of the through holes is not less than 0.20 mm and not more than 50.00 mm.

8. A heat transport structure comprising:
a first thermally conductive material in which through holes are formed;
second thermally conductive materials which are fitted in the respective through holes;
a plurality of fixing parts in which the second thermally conductive materials are held; and
a heat transfer part which is located between the plurality of fixing parts, wherein
a thermal conductivity which the first thermally conductive material exhibits in a surface direction of the first thermally conductive material is higher than a thermal conductivity which the first thermally conductive material exhibits in a perpendicular direction of the first thermally conductive material, the perpendicular direction being a direction perpendicular to the surface direction,
each of the through holes is formed so as to penetrate the first thermally conductive material in the perpendicular direction of the first thermally conductive material,
each of the second thermally conductive materials has a shape of a column having a bulged side surface,
a thermal conductivity which each of the second thermally conductive materials exhibits in the perpendicular direction of the first thermally conductive material is higher than the thermal conductivity which the first thermally conductive material exhibits in the perpendicular direction of the first thermally conductive material,
a heat transfer efficiency ($\lambda2/\lambda1$) is not less than 0.60, the heat transfer efficiency ($\lambda2/\lambda1$) being calculated from (i) a thermal conductivity ($\lambda1$) which the heat transfer part exhibits in the surface direction, wherein the thermal conductivity ($\lambda1$) is derived using a light alternating-current method and (ii) a thermal conductivity ($\lambda2$) which the heat transfer part exhibits in the surface direction, wherein the thermal conductivity ($\lambda2$) is derived from temperatures of the heat transfer part, wherein the temperatures are measured when heat is inputted in one of the plurality of fixing parts, and
a thickness of the heat transfer part is not less than 100 µm.

9. The heat transport structure as set forth in claim 8, wherein:
the first thermally conductive material contains graphite;
a thermal conductivity ($\lambda 1$) which the heat transfer part exhibits in the surface direction is not less than 500 W/m·K, wherein the thermal conductivity ($\lambda 1$) is derived using a light alternating-current method; and
a thermal conductivity which the heat transfer part exhibits in the perpendicular direction is not more than 25 W/m·K, wherein the thermal conductivity is derived using a frequency-changing method.

10. The heat transport structure as set forth in claim 8, wherein a heat transfer density ($\lambda 2/D$) is not less than 0.50 W·m2/K·kg, the heat transfer density ($\lambda 2/D$) being calculated from (i) a thermal conductivity ($\lambda 2$) which the heat transfer part exhibits in the surface direction, wherein the thermal conductivity ($\lambda 2$) is derived from a temperature distribution of the heat transfer part wherein the temperature distribution is measured when heat is inputted in one of the plurality of fixing parts and (ii) a density (D) of the heat transfer part.

11. The heat transport structure as set forth in claim 8, wherein a diameter of each of the through holes is not less than 0.20 mm and not more than 50.00 mm.

12. A heat transport structure comprising:
a first thermally conductive material in which through holes are formed; and
second thermally conductive materials which are fitted in the respective through holes,
a thermal conductivity which the first thermally conductive material exhibits in a surface direction of the first thermally conductive material being higher than a thermal conductivity which the first thermally conductive material exhibits in a perpendicular direction of the first thermally conductive material, the perpendicular direction being a direction perpendicular to the surface direction,
each of the through holes being formed so as to penetrate the first thermally conductive material in the perpendicular direction of the first thermally conductive material,
surface roughness Rz of an inner surface of each of the through holes being not less than 3.5 µm,
a thermal conductivity which each of the second thermally conductive materials exhibits in the perpendicular direction of the first thermally conductive material being higher than the thermal conductivity which the first thermally conductive material exhibits in the perpendicular direction of the first thermally conductive material.

13. The heat transport structure as set forth in claim 12, wherein each of the second thermally conductive materials has a shape of a column having a bulged side surface.

14. The heat transport structure as set forth in claim 12, comprising:
a plurality of fixing parts in which the second thermally conductive materials are held; and
a heat transfer part which is located between the plurality of fixing parts.

15. The heat transport structure as set forth in claim 14, wherein:
the first thermally conductive material contains graphite;
a thermal conductivity ($\lambda 1$) which the heat transfer part exhibits in the surface direction is not less than 500 W/m·K, wherein the thermal conductivity ($\lambda 1$) is derived using a light alternating-current method; and
a thermal conductivity which the heat transfer part exhibits in the perpendicular direction is not more than 25 W/m·K, wherein the thermal conductivity is derived using a frequency-changing method.

16. The heat transport structure as set forth in claim 14, wherein:
heat transfer efficiency ($\lambda 2/\lambda 1$) is not less than 0.60, the heat transfer efficiency ($\lambda 2/\lambda 1$) being calculated from (i) a thermal conductivity ($\lambda 1$) which the heat transfer part exhibits in the surface direction, wherein the thermal conductivity ($\lambda 1$) is derived using a light alternating-current method and (ii) a thermal conductivity ($\lambda 2$) which the heat transfer part exhibits in the surface direction wherein the thermal conductivity ($\lambda 2$) is derived from temperatures of the heat transfer part wherein the which temperatures are measured when heat is inputted in one of the plurality of fixing parts; and
a thickness of the heat transfer part is not less than 100 µm.

17. The heat transport structure as set forth in claim 14, wherein a heat transfer density ($\lambda 2/D$) is not less than 0.50 W·m2/K·kg, the heat transfer density ($\lambda 2/D$) being calculated from (i) a thermal conductivity ($\lambda 2$) which the heat transfer part exhibits in the surface direction, wherein the thermal conductivity ($\lambda 2$) and which is derived from a temperature distribution of the heat transfer part, wherein the which temperature distribution is measured when heat is inputted in one of the plurality of fixing parts and (ii) a density (D) of the heat transfer part.

18. The heat transport structure as set forth in claim 12, wherein a diameter of each of the through holes is not less than 0.20 mm and not more than 50.00 mm.

19. A method of producing a heat transport structure, the method comprising:
a through hole forming step of forming through holes in a first thermally conductive material so that the through holes extend in a perpendicular direction of the first thermally conductive material, the perpendicular direction being a direction perpendicular to a surface direction of the first thermally conductive material, a thermal conductivity which the first thermally conductive material exhibits in the surface direction of the first thermally conductive material being higher than a thermal conductivity which the first thermally conductive material exhibits in the perpendicular direction of the first thermally conductive material;
an inserting step of inserting, into the respective through holes, second thermally conductive materials each of which has a shape of a column thinner than a corresponding one of the through holes; and
a fitting step of fitting the second thermally conductive materials into the respective through holes by compressing the second thermally conductive materials in the perpendicular direction so that the second thermally conductive materials are expanded and deformed in the surface direction,
a volume of each of the second thermally conductive materials being not less than 80% and not more than 150% relative to a volume of a corresponding one of the through holes,
wherein a side surface of each of the second thermally conductive materials which have been subjected to the fitting step is bulged.

20. The method as set forth in claim 19, wherein a thermal conductivity which each of the second thermally conductive materials exhibits in the perpendicular direction of the first thermally conductive material is higher than the thermal conductivity which the first thermally conductive material exhibits in the perpendicular direction of the first thermally conductive material.

21. The method as set forth in claim 19, wherein respective areas of an upper surface and a lower surface of each of the second thermally conductive materials which have not been subjected to the inserting step are each smaller, by not less than 3%, than an area of a corresponding one of the through holes.

22. The method as set forth in claim 19, wherein a thickness of each of the second thermally conductive materials which have not been subjected to the inserting step is greater, by not less than 5%, than a thickness of a corresponding one of the through holes.

* * * * *

UNITED STATES PATENT AND TRADEMARK OFFICE
CERTIFICATE OF CORRECTION

PATENT NO.         : 10,546,797 B2
APPLICATION NO.    : 15/738196
DATED              : January 28, 2020
INVENTOR(S)        : Satoshi Oku et al.

Page 1 of 1

It is certified that error appears in the above-identified patent and that said Letters Patent is hereby corrected as shown below:

In the Claims

Claim 5, Column 33, Line 67, the portion "thermal conductivity ($\lambda 1$) and which is derived" should read -- thermal conductivity ($\lambda 1$) is derived --; and Column 34, Line 5, the portion "transfer part wherein" should read -- transfer part, wherein --.

Claim 6, Column 34, Line 15, the portion "the surface direction wherein" should read -- the surface direction, wherein --.

Claim 16, Column 36, Lines 15-16, the portion "the heat transfer part wherein the which temperatures" should read -- the heat transfer part, wherein the temperatures --.

Claim 17, Column 36, Line 26, the portion "thermal conductivity ($\lambda 2$) and which is derived" should read -- thermal conductivity ($\lambda 2$) is derived --; and Lines 27-28, the portion "the which temperature distribution" should read -- the temperature distribution --.

Signed and Sealed this
Twenty-third Day of June, 2020

Andrei Iancu
*Director of the United States Patent and Trademark Office*